US008990481B2

(12) United States Patent
Yoon et al.

(10) Patent No.: US 8,990,481 B2
(45) Date of Patent: Mar. 24, 2015

(54) METHOD OF OPERATING NONVOLATILE MEMORY DEVICES STORING RANDOMIZED DATA GENERATED BY COPYBACK OPERATION

(75) Inventors: Sang-Yong Yoon, Seoul (KR); Bo-Geun Kim, Suwon-si (KR); Seung-Hwan Shin, Ulsan (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 203 days.

(21) Appl. No.: 13/598,926

(22) Filed: Aug. 30, 2012

(65) Prior Publication Data

US 2013/0124783 A1  May 16, 2013

(30) Foreign Application Priority Data

Nov. 14, 2011  (KR) .................. 10-2011-0118365

(51) Int. Cl.
*G06F 12/00* (2006.01)
*G06F 13/00* (2006.01)
*G06F 13/28* (2006.01)
*G11C 16/26* (2006.01)
(Continued)

(52) U.S. Cl.
CPC ............ *G11C 16/26* (2013.01); *G06F 12/0246* (2013.01); *G11C 13/0002* (2013.01); *G11C 13/0069* (2013.01); *G06F 2212/7203* (2013.01); *G11C 2013/0076* (2013.01); *G11C 2213/71* (2013.01)
USPC ................... 711/103; 711/115; 365/185.33

(58) Field of Classification Search
CPC ............ G06F 12/02; G06F 12/0246; G06F 2212/7203; G11C 13/0002; G11C 13/0069; G11C 16/12; G11C 16/26; G11C 2013/0076; G11C 2213/71

USPC ............... 711/103, 115; 365/185.33, 189.011
See application file for complete search history.

(56) References Cited

U.S. PATENT DOCUMENTS 4,979,832 A * 12/1990 Ritter .......................... 380/28
6,038,321 A *  3/2000 Torigai et al. ............. 380/268
(Continued)

FOREIGN PATENT DOCUMENTS

KR  1020100084888 A  7/2010
KR  1020100099960 A  9/2010
(Continued)

OTHER PUBLICATIONS

Kim et.al. "A 21 nm High Performance 64 Gb MLC NAND Flash Memory With 400 MB/s Asynchronous Toggle DDR Interface" Apr. 2012, Fig. 9, section III.*

*Primary Examiner* — Yaima Rigol
*Assistant Examiner* — Tasnima Matin
(74) *Attorney, Agent, or Firm* — Volentine & Whitt, PLLC

(57) ABSTRACT

In an operating method for a nonvolatile memory device, first random data is sensed from a source area of the memory cell array, the first random data having been generated using first random sequence data. While sensing the first random data, third random sequence data is loaded to a page buffer circuit, the third random sequence data being generated from the first random sequence data and second random sequence data. A logical operation is performed on the sensed first random data and the third random sequence data in the page buffer circuit to generate second random data, and the second random data is programmed to a target area in the memory cell array different from the source area.

19 Claims, 18 Drawing Sheets

(51) Int. Cl.
*G06F 12/02* (2006.01)
*G11C 13/00* (2006.01)

(56) References Cited

U.S. PATENT DOCUMENTS

| | | |
|---|---|---|
| 2006/0227607 A1 | 10/2006 | Park et al. |
| 2009/0204824 A1* | 8/2009 | Lin et al. ................ 713/193 |
| 2009/0228739 A1* | 9/2009 | Cohen et al. ................ 714/6 |
| 2010/0023800 A1* | 1/2010 | Harari et al. ................ 714/2 |
| 2010/0182845 A1 | 7/2010 | Kim et al. |
| 2010/0229001 A1* | 9/2010 | Park et al. ................ 713/190 |
| 2010/0229007 A1* | 9/2010 | Park ................ 713/193 |
| 2010/0259983 A1 | 10/2010 | Yoon |
| 2010/0332951 A1 | 12/2010 | Peng et al. |
| 2011/0016263 A1* | 1/2011 | Lin et al. ................ 711/103 |
| 2011/0119432 A1* | 5/2011 | Yoon ................ 711/103 |
| 2012/0005409 A1* | 1/2012 | Yang ................ 711/103 |
| 2012/0173792 A1* | 7/2012 | Lassa et al. ................ 711/103 |

FOREIGN PATENT DOCUMENTS

| | | |
|---|---|---|
| KR | 1020100099961 A | 9/2010 |
| KR | 1020100111990 A | 10/2010 |
| KR | 1020110055178 A | 5/2011 |

* cited by examiner

FIG. 8
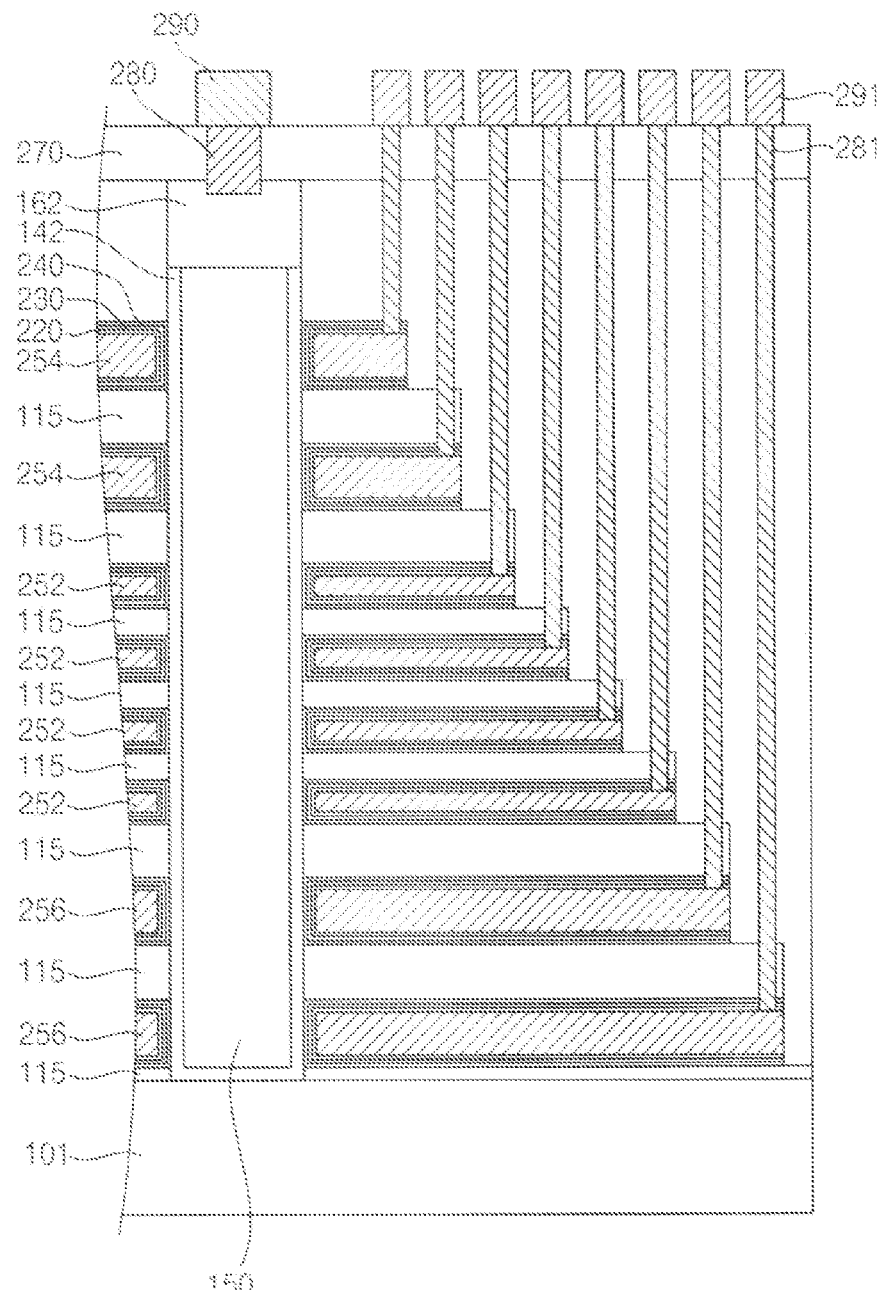
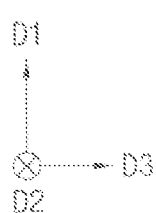

METHOD OF OPERATING NONVOLATILE MEMORY DEVICES STORING RANDOMIZED DATA GENERATED BY COPYBACK OPERATION

CROSS-REFERENCE TO RELATED APPLICATION

This application claims priority under 35 USC §119 to Korean Patent Application No. 2011-0118365, filed on Nov. 14, 2011, the subject matter of which is hereby incorporated by reference.

BACKGROUND

The inventive concept relates to semiconductor memory devices, and more particularly, to methods of operating nonvolatile memory devices.

Semiconductor memory devices may be classified as volatile or nonvolatile according to their data retention capabilities. Volatile memory devices lose stored data in the absence of applied power, while nonvolatile memory devices retain stored data in the absence of applied power.

Nonvolatile memory devices have become mainstay components in contemporary digital systems and consumer electronics. Nonvolatile memory devices may be programmed using a variety of methods. Certain programming operations (and corresponding read operations) recognize the benefits of maintaining a substantially randomized pattern of stored data in a memory cell array. This is particularly true for memory cell arrays including multi-level memory cells (MLC), and for large, three dimensional (3D) memory cell arrays.

SUMMARY

Accordingly to certain embodiments, the inventive concept provides a method of operating a nonvolatile memory device including a memory cell array having respectively designated source and target areas, and a page buffer circuit, the method comprising; sensing first random data stored in the source area, the first random data having been generated using first random sequence data, and while sensing the first random data, loading third random sequence data to the page buffer circuit, the third random sequence data being generated from the first random sequence data and second random sequence data, performing a logical operation on the sensed first random data and the third random sequence data in the page buffer circuit, and programming second random data to the target area, the second random data being generated by the performing of the logical operation.

Accordingly to certain embodiments, the inventive concept provides a method of operating a nonvolatile memory device comprising a memory cell array, a page buffer circuit and a randomization interface, the method comprising; sensing first random data stored in a source area of the memory cell array, the first random data having been randomized based on a first random sequence data, generating a third random sequence data in the randomization interface while sensing the first random data, the third random sequence data being generated based on the first random sequence data and a second random sequence data, performing logical operation on the sensed first random data and the third random sequence data in the randomization interface to generate second random data, and then programming the second random data to a target area of the memory cell array different from the source area.

Accordingly to certain embodiments, the inventive concept provides a method of performing a copy back operation in a nonvolatile memory device including a memory cell array having respectively designated source and target areas, the method comprising; sensing first random data stored in the source area, the first random data having been randomized from input data during a preceding program operation using first random sequence data, while sensing the first random data, simultaneously loading third random sequence data to a page buffer circuit, the third random sequence data being generated by a bit-wise exclusive-OR (XOR) operation performed on the first random sequence data and second random sequence data, performing a bit-wise XOR operation on the sensed first random data and the third random sequence data in the page buffer circuit to generate second random data, and then, programming the second random data to the target area.

BRIEF DESCRIPTION OF THE DRAWINGS

Illustrative embodiments of the inventive concept are described hereafter with reference to the accompanying drawings.

FIGS. 3 through 8 are diagrams illustrating examples of a memory cell array that may be incorporated in the nonvolatile memory device of FIG. 2.

DETAILED DESCRIPTION OF THE EMBODIMENTS

Various embodiments of the inventive concept will now be described in some additional detail with reference to the accompanying drawings. This inventive concept may, however, be embodied in many different forms and should not be construed as being limited to only the illustrated embodiments. Rather, these embodiments are provided so that this disclosure will be thorough and complete and will fully convey the scope of the inventive concept to those skilled in the art. Throughout the written description and drawings, like reference numbers refer to like or similar elements and features.

It will be understood that, although the terms first, second, etc. may be used herein to describe various elements, these elements should not be limited by these terms. These terms are used to distinguish one element from another. For example, a first element could be termed a second element, and, similarly, a second element could be termed a first element, without departing from the scope of the inventive concept. As used herein, the term "and/or" includes any and all combinations of one or more of the associated listed items.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between," "adjacent" versus "directly adjacent," etc.).

The terminology used herein is for the purpose of describing particular embodiments and is not intended to be limiting of the inventive concept. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements, and/or components, but do not preclude the presence or addition of one or more other.

Unless otherwise defined, all terms (including technical and scientific terms) used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Figure 1:
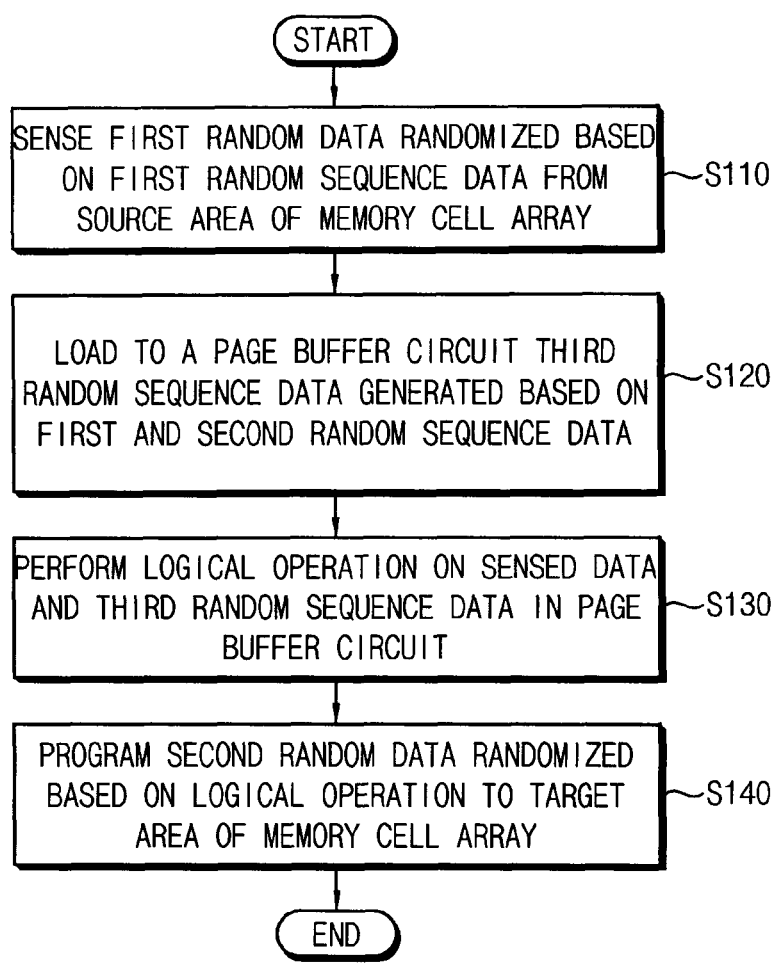
FIG. 1 is a flowchart summarizing a method of operating a nonvolatile memory device according to certain embodiments of the inventive concept.

FIG. 1 is a flowchart summarizing a method of operating a nonvolatile memory device according to certain embodiments of the inventive concept.

Referring to FIG. 1, a nonvolatile memory device is assumed to include a memory cell array having a designated source area and target area, and a page buffer circuit. The operating method comprises sensing first random data stored in the source area (S110). The first random data has been generated during a previously performed program operation by randomizing input data using first random sequence data. Thus, the first random data may be said to be "based on" the first random sequence data. When generated, the first random data was stored in the source area of the memory cell array.

After the first random data has been sensed, third random sequence data is loaded to the page buffer circuit (S120). The third random sequence data is logically or computationally generated using a first logical operation performed on the first random sequence data and a second random sequence data different from the first random sequence data. Thus, the third random sequence data may be generated by performing bit-wise exclusive OR (XOR) operation—as one example of many logical operations that may be used for this purpose—on the first random sequence data and the second random sequence data.

Once the third random sequence data has been generated and loaded to the page buffer circuit, a second logical operation may be performed in the page buffer circuit on the first random data and the third random sequence data (S130) to generate second random data. For example, the second random data may be generated by performing a bit-wise XOR operation on the first random data and the third random sequence data. Thus, both the first logical operation generating the third random sequence data and the second logical operation generating the second random data may be the same type of logical operation. However, they may alternately be different types of logical operations.

Thus, the first random data is simultaneously randomized and de-randomized using a logical operation (e.g., the bit-wise XOR operation) performed on the first random data and the third random sequence data. Once generated, the second random data may be programmed to the target area of the memory cell array (S140).

In certain embodiments of the inventive concept, the first random sequence data may be based on at least one source address corresponding to the source area. That is, at least one "source area address" may be used as a seed value for generation of the first random sequence data. In certain embodiments, the source area will include a number of source pages, and the first random sequence data may be generated using at least one "source area page address" as a seed value. Additionally, the source area may include a source block, and (alternately) the first random sequence data may be generated using a source area page address and a source area block address as seed values.

In similar manner, the target area of the memory cell array may include a number of target pages, and the second random sequence data may be generated using at least one "target area page address" as a seed value. Additionally, the target area may include a target block, and the second random sequence data may (alternately) be generated using a target area page address and a target area block address as seed values.

According to certain embodiments of the inventive concept, a method of operating a nonvolatile memory device is provided wherein third random sequence data is generated by performing bit-wise exclusive OR operation on the first random sequence data generated based on the address of the source area, and second random sequence data is generated based on the addresses of the target area, the second random data is generated by performing bit-wise exclusive OR operation on the sensed first random data and the third random sequence data, and the second random data is programmed in the target area of the memory cell array. The foregoing sequence of related operations may be understood as a particular type of "copy back programming operation". Therefore, the constituent randomization operation and de-randomization operation are simultaneously performed on the first random data previously stored in a memory cell array. Those skilled in the art will understand that the data transfer and computational overhead associated with this copy back programming operation are relatively low.

Figure 2:
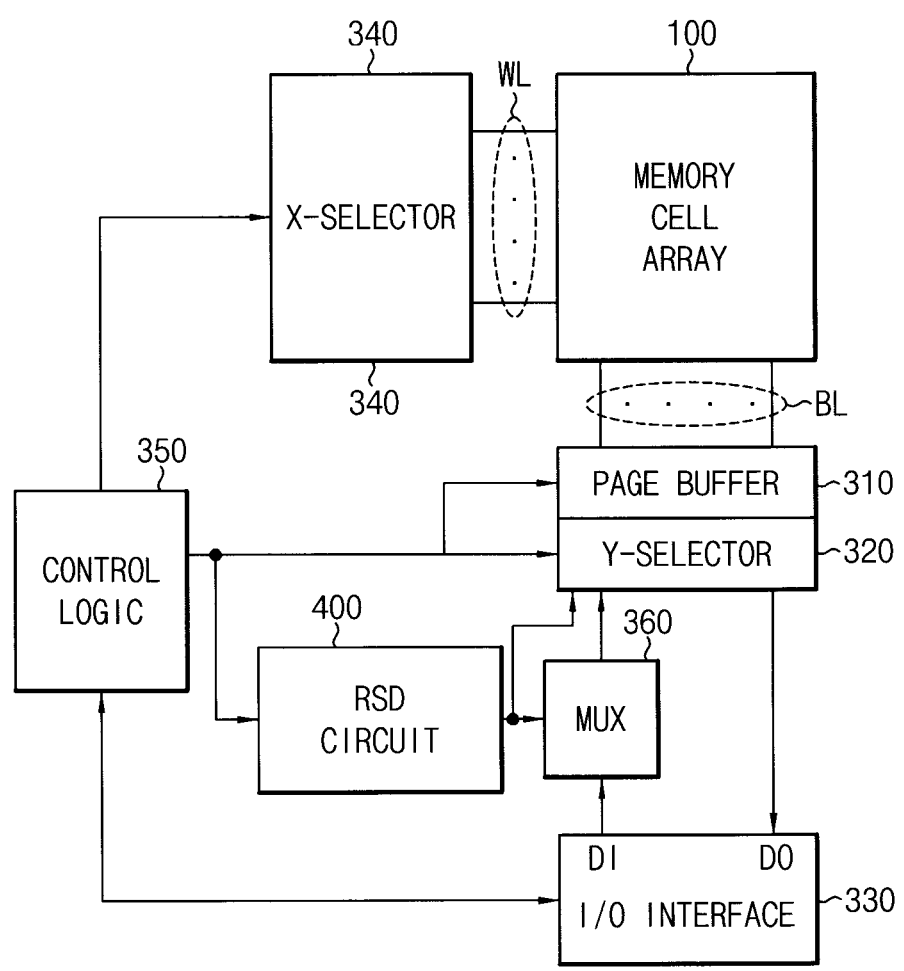
FIG. 2 is a block diagram illustrating a nonvolatile memory device according to certain embodiments of the inventive concept.

FIG. 2 is a block diagram illustrating a nonvolatile memory device according to certain embodiments of the inventive concept.

Referring to FIG. 2, a nonvolatile memory device 10 comprises a memory cell array 100, a page buffer circuit 310, a column selector (y-selector) 320, a row selector (x-selector) 340, an input/output (I/O) interface 330, a control logic 350, a random sequence data generation circuit 400 and a multiplexer 360.

The memory cell array 100 includes a plurality of memory cells each of which is connected to a respective one of wordlines WL and a respective one of bitlines BL. As will be described hereafter in some additional detail with reference to FIGS. 3 through 8, the plurality of memory cells may include NAND flash memory cells or NOR flash memory cells, and may be arranged in a two-dimensional (2-D) array structure or a three-dimensional (3-D) vertical array structure (e.g., a vertical memory device having a stacked structure).

In an certain embodiments, the plurality of memory cells may include either of single-level memory cells (SLC) in which only one bit is stored in each of memory cells or multi-level memory cells (MLC) in which more than two bits are stored in each of memory cells. In the MLC, the memory cells may be programmed using various program methods, such as a shadow programming scheme, a reprogramming scheme or an on-chip buffered programming scheme.

The row selector 340 is controlled by the control logic 350 and performs selecting and driving operations for rows of the memory cell array 100. The control logic 350 is configured to control an overall operation of the flash memory device. The page buffer circuit 310 is controlled by the control logic 350 and functions as a sense amplifier or a write driver according to an operation mode. For example, during a read operation, the page buffer circuit 310 functions as a sense amplifier sensing data from memory cells of a selected row. During a program operation, the page buffer circuit 310 functions as a write driver driving memory cells of a selected row according to program data. The page buffer circuit 310 includes page buffers corresponding to each of bit lines or bit line pairs. When respective memory cells store multi-bit data, respective page buffers of the page buffer circuit 310 may be configured to have two or more latches.

The column selector 320 is controlled by the control logic 350 and selects columns (or page buffers) in a predetermined sequence during read/program operation. The I/O interface 330 outputs data from the page buffer circuit 310 via the column selector 320 to one or more external circuits.

The random sequence generation circuit 400 is controlled by the control logic 350 and generates random sequence data RSD sequentially using seed values. The random sequence data RSD may be one bit data. In addition, the random sequence data (RSD0 may include two or more bits. The multiplexer 360 is controlled by the control logic 350. The multiplexer 360 may provide output of the I/O interface 330 to the column selector 320 during data loading time of program operation. When the data loading time is completed, the multiplexer 360 may provide output of the random sequence generation circuit 400 to the column selector 320. More particularly, when the data loading time of program operation is completed, the multiplexer 360 may provide the random sequence data RSD of the random sequence generation circuit 400 to the column selector 320. During a copy back program operation executed by the nonvolatile memory device 10, the third random sequence data may be directly provided to the column selector 320.

The page buffer circuit 310 receives program data during the data loading time and receives the random sequence data RSD after the data loading time is completed. In order to accomplish this, each page buffer of the page buffer circuit 310 may have at least two latches, one to store the program data and the other to store the random sequence data RSD. The page buffer circuit 310 executes a bit-wise XOR operation on the inputted program data based on the inputted random sequence data, under the control of the control logic 350. Each page buffer of the page buffer circuit 310 may include another latch to store the randomized program data. In addition, each page buffer of the page buffer circuit 310 may be configured to store the randomized program data to the latch that stored the program data before the execution of the XOR operation. For the execution of XOR operation, each page buffer may include XOR logic circuit.

Execution of bit-wise XOR of each page buffer of the page buffer circuit 310 also occurs for a read operation in the same way as program operation. While data from the memory cell array 100 is sensed in each page buffer, the page buffer circuit 310 receives a random sequence data RSD from the random sequence generation circuit 400 through the multiplexer 360. After finishing data sensing operation, the page buffer circuit 310 executes a bit-wise XOR operation on the sensed data based on the random sequence data RSD, under the control of the control logic 350. As a result of the bit-wise XOR operation, the sensed data is de-randomized as original (input) program data.

During the copy back program operation executed by the nonvolatile memory device 10, while the first random data randomized based on the first random sequence data RSD1 is sensed from the source area of the memory cell array 100, a third random sequence data RSD3 is loaded to the page buffer circuit 310, which is generated by performing XOR operation on the first random sequence data RSD1 and a second random sequence data RSD2. The second random sequence data RSD2 may be generated using at least one target area address as a seed value. The page buffer circuit 310 performs bit-wise XOR operation on the sensed first random data and the third random sequence data RSD3 under the control of the control logic 350. As a result, the sensed first random data is derandomized and randomized and a second random data is generated. The page buffer circuit 310 may then program the second random data to the target area of the memory cell array 100 under the control of the control logic 350.

FIGS. 3 through 8 are diagrams illustrating examples of certain memory cell arrays that might be incorporated in the nonvolatile memory device of FIG. 2.

Figure 3:
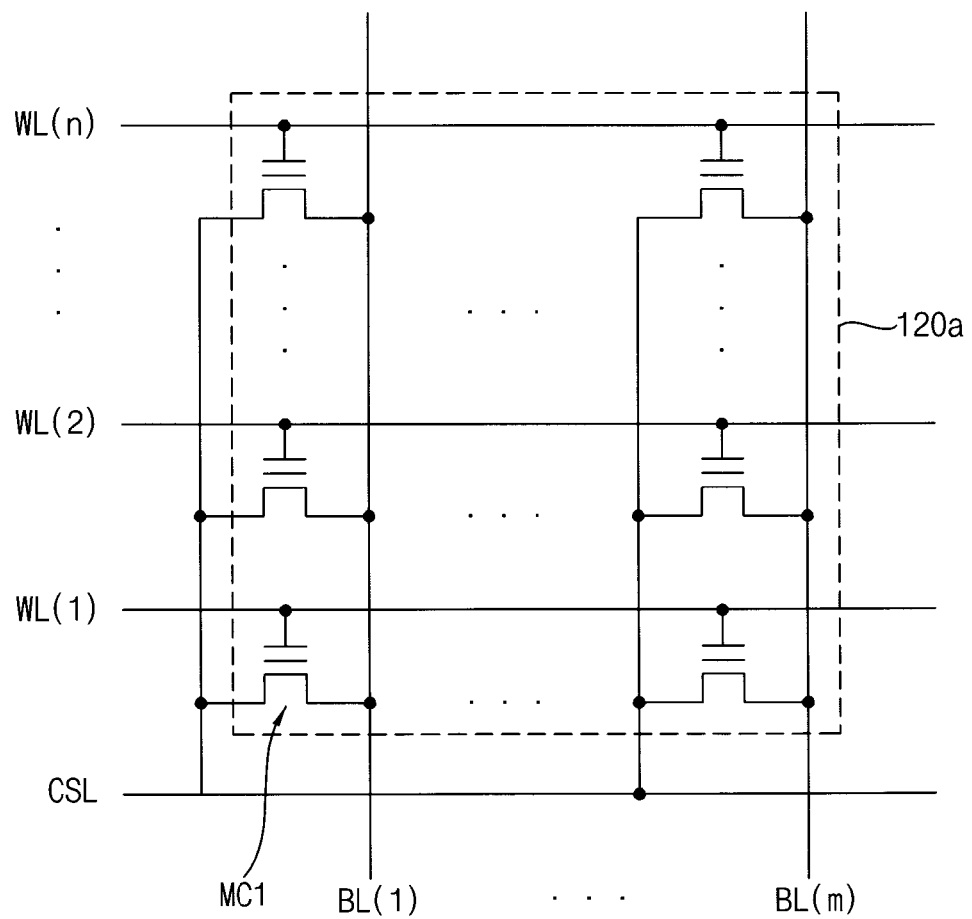
Figure 4:
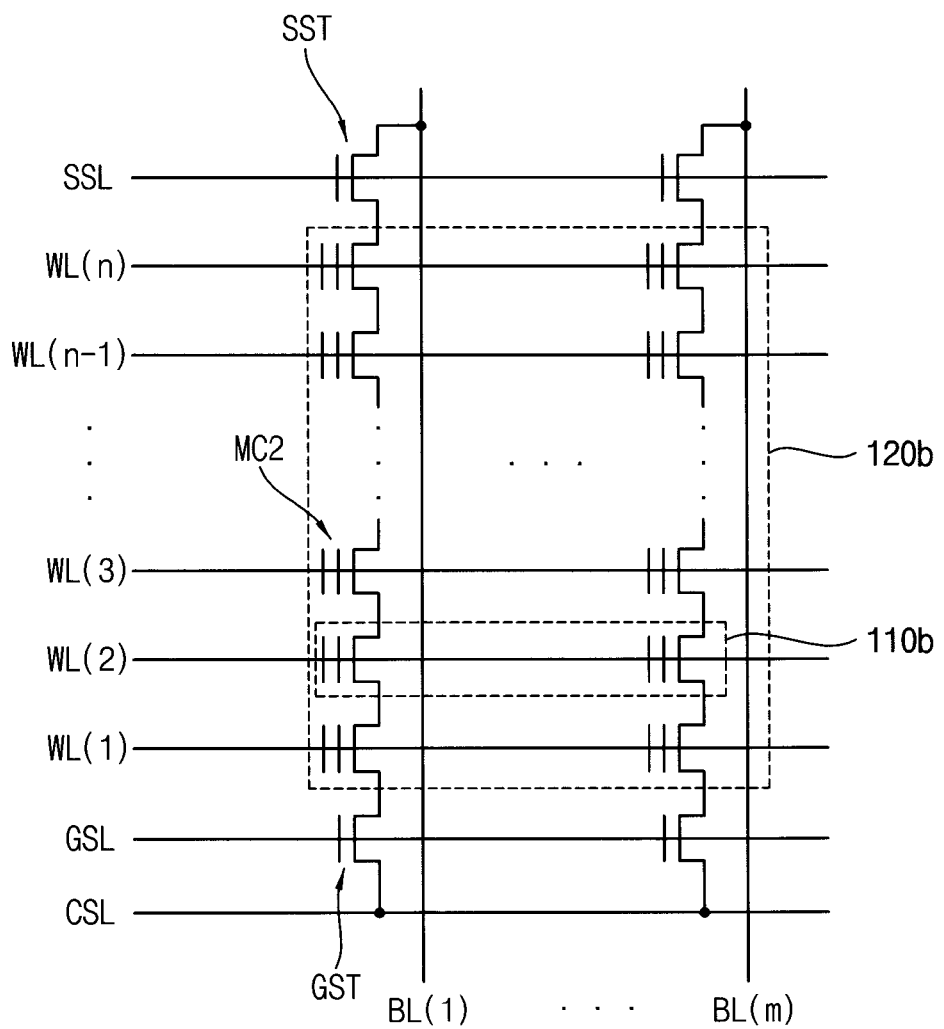
Figure 5:
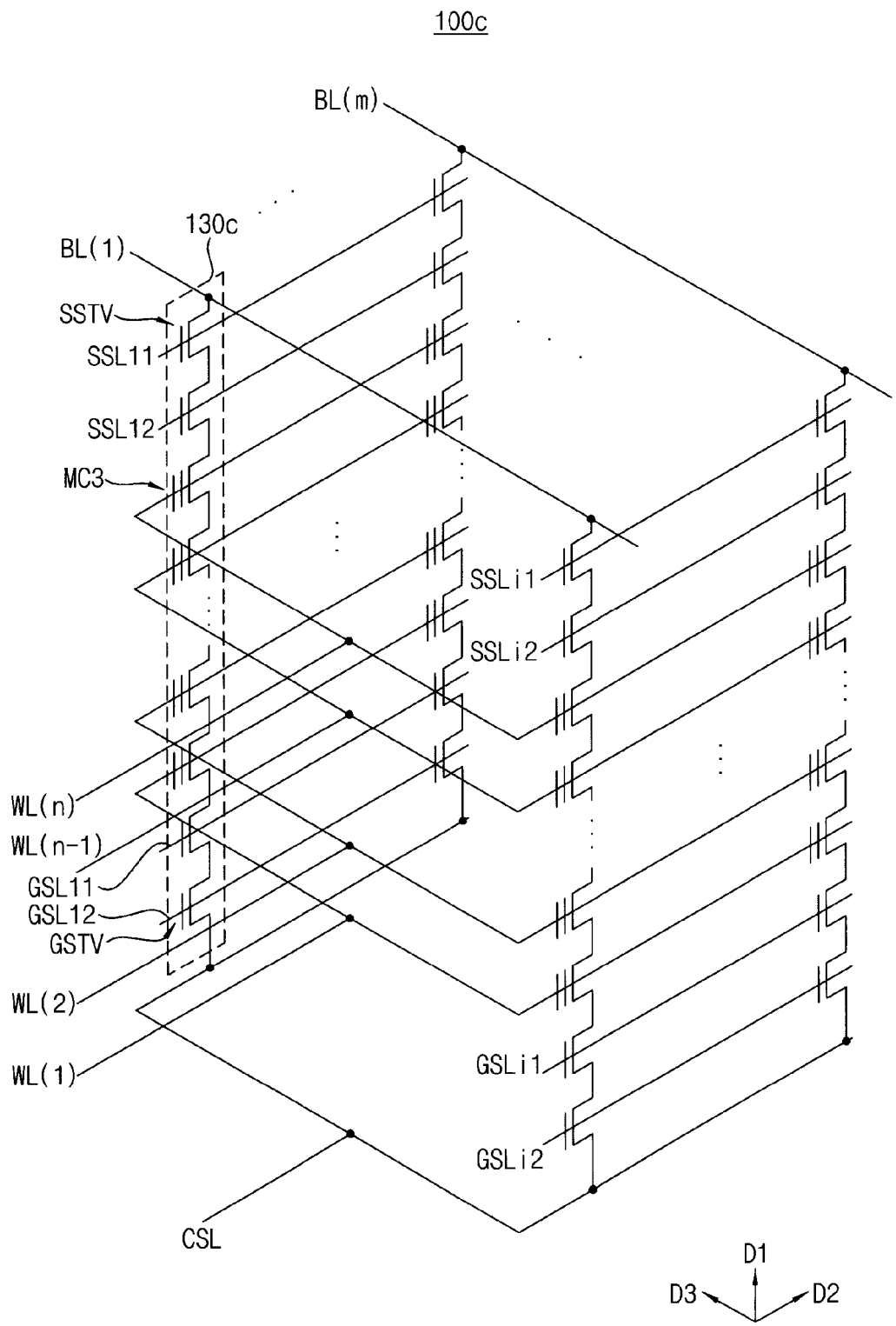
Figure 6:
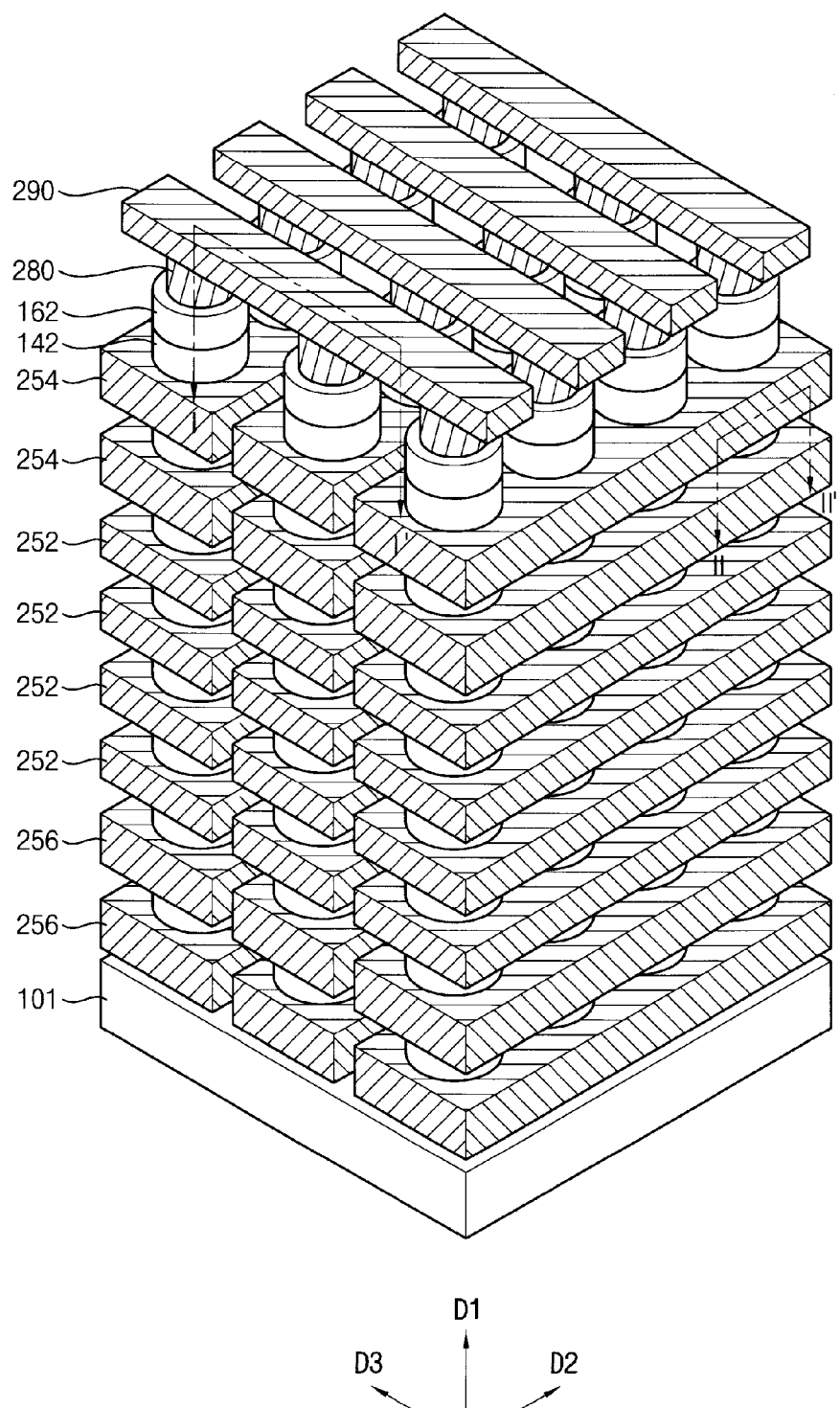
Figure 7:
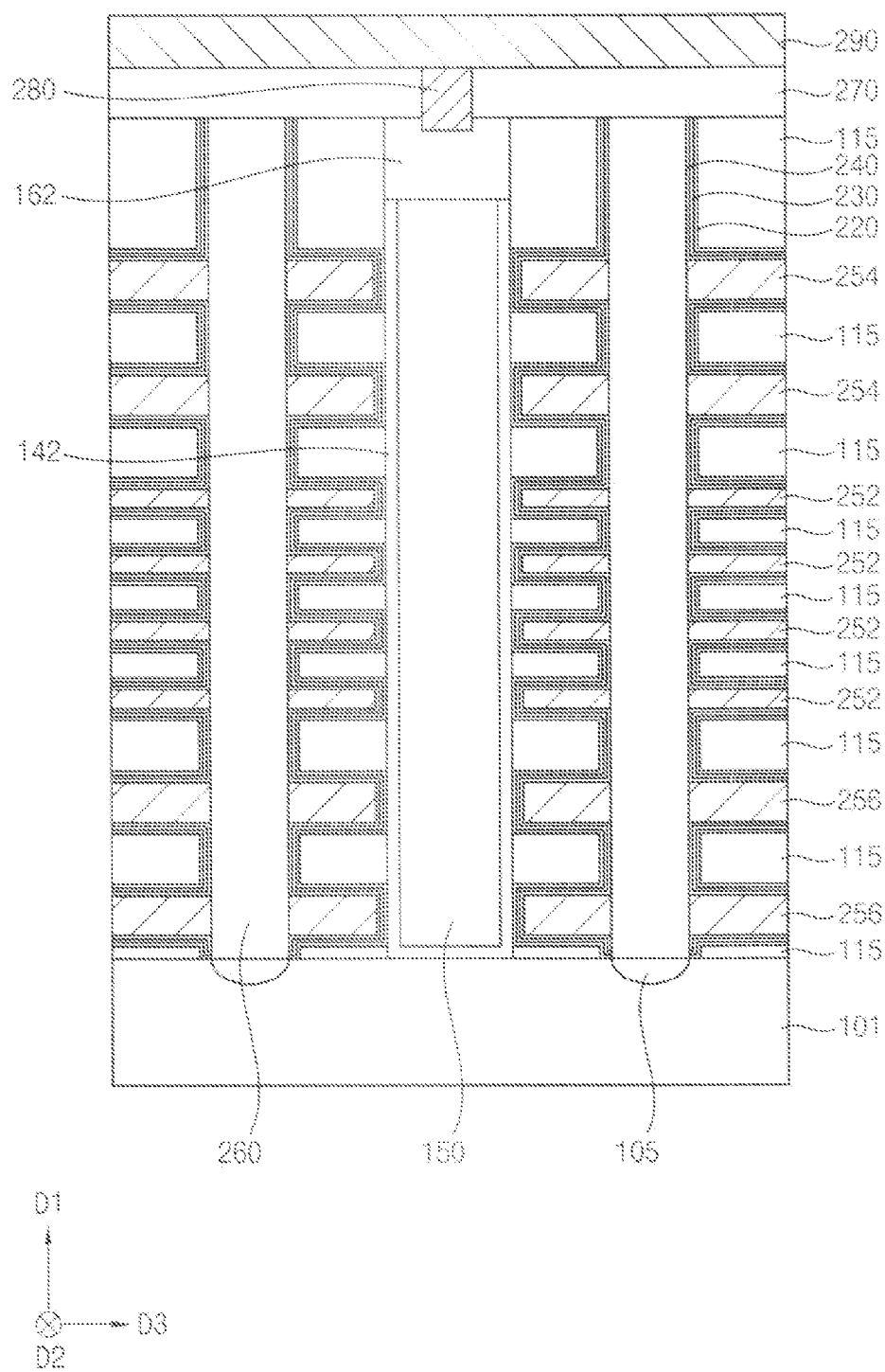

FIG. 3 is a circuit diagram illustrating a memory cell array included in a NOR flash memory device. FIG. 4 is a circuit diagram illustrating a memory cell array included in a NAND flash memory device. FIG. 5 is a circuit diagram illustrating a memory cell array included in a vertical flash memory device. FIG. 6 is a perspective diagram for describing the vertical flash memory device. FIG. 7 is a cross-sectional view of the vertical flash memory device of FIG. 6 cut along the line I-I'. FIG. 8 is a cross-sectional view of the vertical flash memory device of FIG. 6 cut along the line II-II'.

Referring to FIG. 3, a memory cell array 100a may include a plurality of memory cells MC1. Memory cells in the same column may be connected in parallel between one of bitlines BL(1), . . . , BL(m) and a common source line CSL. Memory cells in the same row may be commonly connected to the same wordline among wordlines WL(1), . . . , WL(n). For example, memory cells in a first column may be connected in parallel between a first bitline BL(1) and the common source line CSL. Memory cells in a first row may be commonly connected to a first wordline WL(1). The memory cells MC1 may be controlled by a voltage on the wordlines WL(1), . . . , WL(n).

In the NOR flash memory device including the memory cell array 100a, a read operation and a program operation may be performed per byte or word, and an erase operation may be performed per block 120a. In the program operation, a bulk voltage having a range of about −0.1 to −0.7 volts may be applied to a bulk substrate of the NOR flash memory device.

Referring to FIG. 4, the memory cell array 100b may include string select transistors SST, ground select transistors GST and a plurality of memory cells MC2. The string select transistors SST may be connected to bitlines BL(1), . . . , BL(m), and the ground select transistors GST may be connected to a common source line CSL. The memory cells MC2 may be connected in series between the string select transistors SST and the ground select transistors GST. Memory cells in the same row may be connected to the same wordline among wordlines WL(1), . . . , WL(n). For example, 16, 32 or 64 wordlines may be disposed between a string select line SSL and a ground select line GSL.

The string select transistors SST may be connected to the string select line SSL, and may be controlled by a voltage on the string select line SSL. The ground select transistors GST may be connected to the ground select line GSL, and may be controlled by a voltage on the ground select line GSL. The memory cells MC2 may be controlled by a voltage on the wordlines WL(1), . . . , WL(n).

In the NAND flash memory device including the memory cell array 100b, a read operation and a program operation may be performed per page 110b, and an erase operation may be performed per block 120b. During the program operation, a bulk voltage having a level of about 0 volt may be applied to a bulk substrate of the NAND flash memory device. According to embodiments, each page buffer 310 of FIG. 2 may be connected to an odd-numbered bitline and an even-numbered bitline. In this case, the odd-numbered bitlines may form odd-numbered pages, the even-numbered bitlines may form even-numbered pages, and program operations for the odd-numbered pages and the even-numbered pages may be alternately performed.

Referring to FIG. 5, a memory cell array 100c may include a plurality of strings 130c each of which has a vertical structure. The plurality of strings 130c may be formed in a second direction to define a string column, and a plurality of string columns may be formed in a third direction to define a string array. Each string may include string select transistors SSTV, ground select transistors GSTV, and a plurality of memory cells MC3 that are formed in a first direction D1 and are connected in series between the string select transistors SSTV and the ground select transistors GSTV.

The string select transistors SSTV may be connected to bitlines BL(1), . . . , BL(m), and the ground select transistors GST may be connected to a common source line CSL. The string select transistors SSTV may be connected to string select lines SSL11, SSL12, . . . , SSLi1, SSLi2, and the ground select transistors GSTV may be connected to ground select lines GSL11, GSL12, . . . , GSLi1, GSLi2. The memory cells in the same layer may be connected to the same wordline among wordlines WL(1), WL(2), . . . WL(n−1), WL(n). Each string select line and each ground select line may extend in the second direction D2, and the string select lines SSL11, . . . , SSLi2 and the ground select lines GSL11, . . . , GSLi2 may be formed in the third direction D3. Each wordline may extend in the second direction D2, and the wordlines WL(1), . . . , WL(n) may be formed in the first direction D1 and the third direction D3. Each bitline may extend in the third direction D3, and the bitlines BL(1), . . . , BL(m) may be formed in the second direction D2. The memory cells MC3 may be controlled by a voltage on the wordlines WL(1), . . . , WL(n).

Similarly to the NAND flash memory device, in the vertical flash memory device including the memory cell array 100c, a read operation and a program operation may be performed per page, and an erase operation may be performed per block.

Although not illustrated in FIG. 5, according to embodiments, two string select transistors included in a single string may be connected to a single string select line, and two ground select transistors included in the single string may be connected to a single ground select line. According to embodiments, the single string may include one string select transistor and one ground select transistor.

Referring to FIGS. 6, 7 and 8, the vertical flash memory device may include a ground select line 256, a wordline 252 and a string select line 254 that are spaced apart from each other along a first direction D1 substantially perpendicular to a top surface of a substrate 101, and a channel 142 extending from the substrate 101 in the first direction D1 on sidewalls of the ground select line 256, the wordline 252 and the string select line 254. The vertical flash memory device may further include a bitline 290 electrically connected to the channel 142, and a common source line 105. The bitline 290 may be electrically connected to the channel 142 via a pad 162 and a bitline contact 280.

The channel 142 may include polysilicon or doped polysilicon. For example, the channel 142 may include polysilicon doped with p-type impurities, e.g., polysilicon doped with indium or gallium. The channel 142 may further include carbon and/or germanium. A plurality of channels 142 may be formed in a second direction substantially parallel to the top surface of the substrate 101 to define a channel column, and a plurality of channel columns may be formed in a third direction D3 substantially perpendicular to the second direction D2 to define a channel array.

The channel 142 may be cup shaped and/or of a hollow cylindrical shape. A filling layer pattern 150 may be formed in a space defined by an inner sidewall of the, for example, cup shaped channel 142. The filling layer pattern 150 may include, for example, an insulating material (e.g., an oxide).

The pad 162 may be on the filling layer pattern 150 and the channel 142, and may electrically connect the channel 142 to the bitline contact 280. The pad 162 may serve as a source/drain region by which charges may be moved through the channel 142. The pad 162 may include doped polysilicon. For example, the pad 162 may include polysilicon doped with impurities, e.g., phosphorous, arsenic, etc. When the pad 162 includes polysilicon doped with phosphorous, the pad 162 may further include carbon.

Each of the ground select line 256, the wordline 252 and the string select line 254 may be at a single level (e.g., one of each, each at a different height) or more than one level, and a first insulation layer pattern 115 may be interposed therebetween. In FIG. 6, the ground select line 256 and the string select line 254 may be at 2 levels (e.g., two of each at different heights), respectively, and the wordline 252 may be at 4 levels between the ground select line 256 and the string select line 254. However, the ground select line 256 and the string select line 254 may be at one level, and the wordline 252 may be formed at 2, 8 or 16 levels. According to embodiments, each of the ground select line 256, the wordline 252 and the string select line 254 may extend in the second direction D2, and a plurality of ground select lines 256, a plurality of wordlines 252, and a plurality of string select lines 254 may be in the third direction D3. The first insulation layer pattern 115 may include, for example, a silicon oxide (e.g., silicon dioxide ($SiO_2$), silicon oxycarbide (SiOC) and/or silicon oxyfluoride (SiOF)).

A tunnel insulation layer pattern 225, a charge trapping layer pattern 235 and a blocking layer pattern 245 may be between each of the ground select line 256, the wordline 252 and the string select line 254, and an outer sidewall of the channel 142 in a direction substantially perpendicular to the outer sidewall of the channel 142. The tunnel insulation layer pattern 225, the charge trapping layer pattern 235 and the blocking layer pattern 245 may be between each of the ground select line 256, the wordline 252 and the string select line 254, and the first insulation layer pattern 115 and/or on a sidewall of the first insulation layer pattern 115. According to certain embodiments of the inventive concept, the tunnel insulation layer pattern 225 may be only on the outer sidewall of the channel 142.

The ground select line 256, the wordline 252 and the string select line 254 may include, for example, a metal and/or a metal nitride. For example, the ground select line 256, the wordline 252 and the string select line 254 may include a metal and/or a metal nitride with low electrical resistance (e.g., tungsten, tungsten nitride, titanium, titanium nitride, tantalum, tantalum nitride and/or platinum). According to at least one example embodiment, each of the ground select line 256, the wordline 252 and the string select line 254 may be a multi-layered structure including a barrier layer, for example, a metal nitride and/or a metal layer including a metal.

The tunnel insulation layer pattern 225 may include a silicon oxide, and the charge trapping layer pattern 235 may include a nitride (e.g., a silicon nitride and/or a metal oxide). The blocking layer pattern 245 may include a silicon oxide and/or a metal oxide (e.g., aluminum oxide, hafnium oxide, lanthanum oxide, lanthanum aluminum oxide, lanthanum hafnium oxide, hafnium aluminum oxide, titanium oxide, tantalum oxide and/or zirconium oxide). The blocking layer pattern 245 may be a multi-layered structure of a silicon oxide layer and a metal oxide layer.

A second insulation layer pattern 260 may be between structures each of which may include the ground select line 256, the wordline 252 and the string select line 254 extending in the second direction and the first insulation layer pattern 115 therebetween. The second insulation layer pattern 260 may include an insulating material (e.g., an oxide). The impurity region 105 may be at an upper portion of the substrate 100 beneath the second insulation layer pattern 260, which may extend in the second direction and serve as a common source line. The impurity region 105 may include n-type impurities, for example, phosphorus and/or arsenic.

The bitline 290 may be electrically connected to the pad 162 via the bitline contact 280, and may be electrically connected to the channel 142. The bitline 290 may include, for example, a metal, a metal nitride and/or doped polysilicon. The bitline 290 may extend in the third direction. The bitline contact 280 may be contained in a third insulation layer 270, and contact the pad 162. The bitline contact 280 may include, for example, a metal, a metal nitride and/or doped polysilicon. Metal lines 291 may be electrically connected to the ground select line 256, the wordline 252 and the string select line 254 through contact plugs 281, and thus electrical signals applied to the metal lines 291 may be provided to the ground select line 256, the wordline 252 and the string select line 254.

The third insulation layer 270 may be on the first and second insulation layer patterns 115 and 260, the channel 142, the pad 162, the blocking layer pattern 245, the charge trapping layer pattern 235 and the tunnel insulation layer pattern 225. The third insulation layer 270 may include an insulating material, for example, an oxide.

Figure 9:
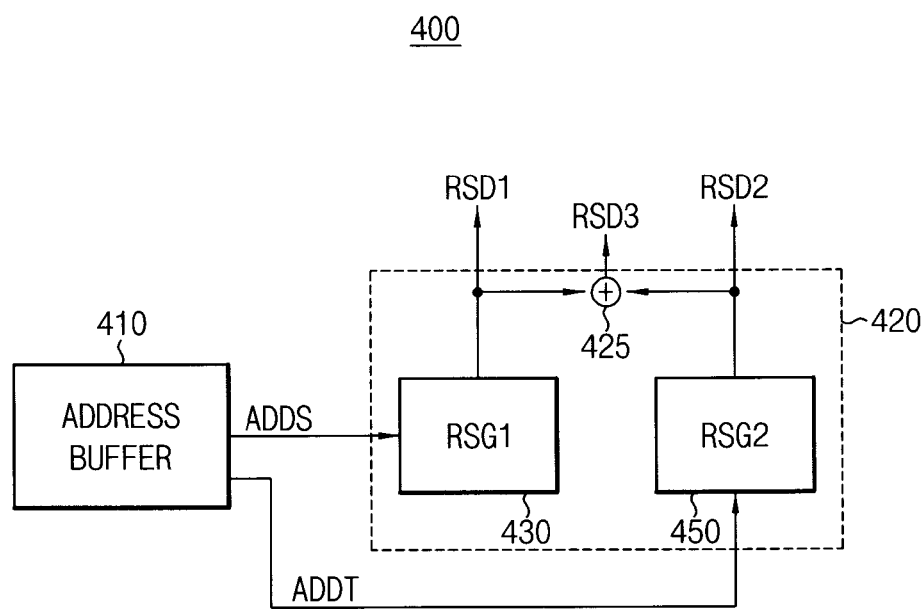
FIG. 9 is a block diagram further illustrating the random sequence generation circuit of FIG. 2 according to certain embodiments of the inventive concept.

FIG. 9 is a block diagram further illustrating the random sequence generation circuit of FIG. 2 according to certain embodiments of the inventive concept.

Referring to FIG. 9, the random sequence generation circuit 400 comprises an address buffer 410 and a random sequence generation unit 420. The random sequence generation unit 420 includes a first random sequence generator 430, a second random sequence generator 450 and a XOR gate 425.

The address buffer 410 may be sued to provide the random sequence generation unit 420 with one or more "source addresses" ADDS associated with the source area of the memory cell array 100, and also one or more "target addresses" ADDT associated with the target area of the memory cell array 100. The first random sequence generator (RSG1) 430 may be used to generate a first random sequence data RSD1 using the source addresses ADDS as seed values. The second random sequence generator (RSG2) 450 may be used to generate a second random sequence data RSD2 using the target addresses ADDT as seed values. The XOR gate 425 may be used to perform a bit-wise XOR operation on the first random sequence data RSD1 and the second random sequence data RSD2 to generate a third random sequence data RSD3.

During a program operation executed by the nonvolatile memory device 10, the page buffer circuit 310 performs bit-wise XOR operation on the program data and the first random sequence data RSD1 to generate the first random data to be programmed in the source area of the memory cell array 100. During a subsequent read operation executed by the nonvolatile memory device 10, the first random sequence data RSD1 is loaded to the page buffer circuit 310 while the first random data is sensed from the source area of the memory cell array 100, and the page buffer circuit 310 derandomizes the first random data by performing bit-wise XOR operation on the first random data and the first random sequence data RSD1. The de-randomized data may be provided to the I/O interface 330 via the column selector 320.

During a program operation executed by the nonvolatile memory device 10, while the first random data randomized based on the first random sequence data RSD1 is sensed from the source area of the memory cell array 100, the third random sequence data RSD3 is loaded to the page buffer circuit 310 via the column selector 320, which is generated by performing bit-wise XOR operation on the first random sequence data RSD1 and the second random sequence data RSD2 generated based on the target addresses ADDT of the target area of the memory cell array 100. The page buffer circuit 310 simultaneously derandomizes and randomizes the sensed first random data to generate the second random data by performing bit-wise XOR operation on the sensed first random data and the third random sequence data RSD3. The page buffer circuit 310 may then program the second random data to the target area of the memory cell array 100.

In order to subsequently read the second random data from the target area of the memory cell array 100, the second random sequence data RSD2 is loaded to the page buffer circuit 310 while the second random data is sensed from the target area of the memory cell array 100. The page buffer circuit 310 derandomizes the sensed second random data by performing bit-wise XOR operation on the sensed second random data and the second random sequence data RSD2. The de-randomized data may then be provided via the I/O interface 330 to the column selector 320.

Figure 10:
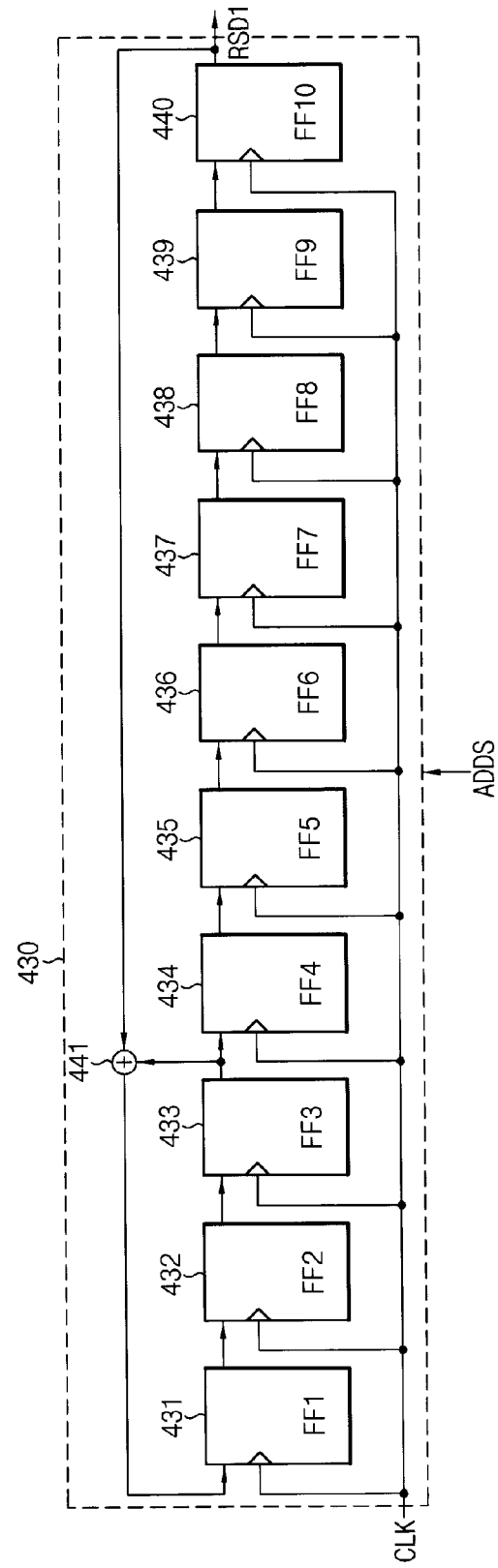
FIG. 10 is a circuit diagram further illustrating the first random sequence generator of FIG. 9 according to certain embodiments of the inventive concept.

FIG. 10 is a circuit diagram further illustrating the first random sequence generator of FIG. 9 according to certain embodiments of the inventive concept. In certain embodiments, the second random sequence generator 450 may be implemented with substantially the same configuration as the first random sequence generator 430.

Referring to FIG. 10, the first random sequence generator 430 may include a linear feedback shift register LFSR having shift registers of a plurality of flip-flops 431~440 and a XOR gate 441. The first random sequence generator 430 may be implemented by a PN sequence generator, a CRC generator, and the like. The first random sequence generator 430 generates the first random sequence data RSD1 using the source addresses ADDS to be accessed for operation as a seed value. The second random sequence generator 450 may generate the second random sequence data RSD2 using the target addresses ADDT as a seed value.

Figure 11:
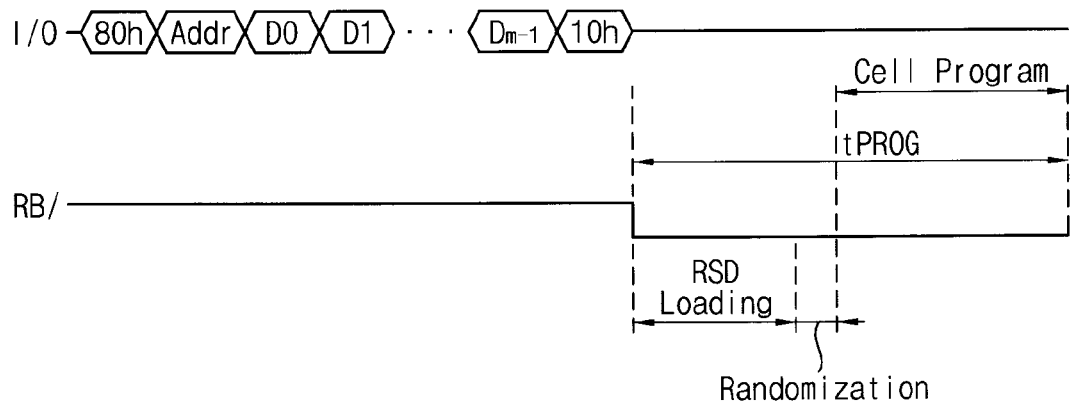
FIG. 11 is a timing diagram illustrating a program operation for a nonvolatile memory device according to certain embodiments of the inventive concept.
Figure 12:
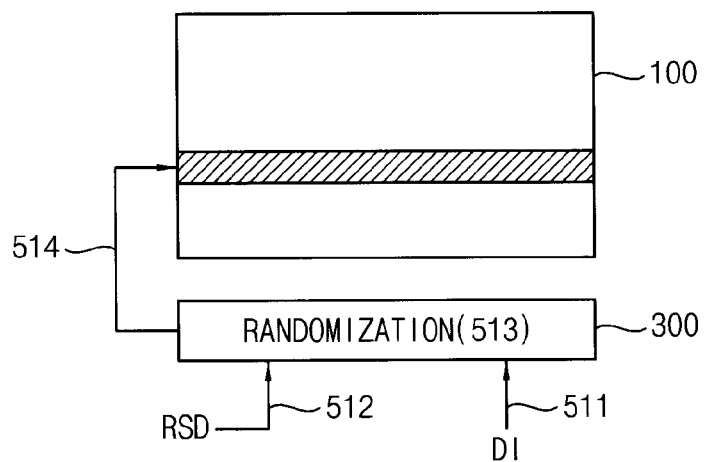
FIG. 12 is a conceptual diagram illustrating data flow in the nonvolatile memory device during a program operation according to certain embodiments of the inventive concept.

FIG. 11 is a timing diagram illustrating a program operation of the nonvolatile memory device according to certain embodiments of the inventive concept. FIG. 12 illustrates data flow in the nonvolatile memory device during the program operation of FIG. 11.

First, a serial input command '80h' is inputted to the nonvolatile memory device 10 from an external device. Then an address (Addr), including a row address and a column address, and program data D0~Dm-1 are provided to the nonvolatile memory device 10 from the external device such as a memory controller with a certain timing sequence. See, 511 in FIG. 12. The row address includes a plurality of addresses including a block address and a page address. The program data is loaded into the page buffer circuit 310 through the multiplexer 360 and the column selector 320 under the control of the control logic 350. After completion of the data loading into the page buffer circuit 310, a program command '10h' is inputted to the nonvolatile memory device 10. Then, a Ready/Busy signal (RB/) changes to low to indicate that the nonvolatile memory device 10 is in a busy state.

When the program command '10h' is received, the control logic 350 controls the random sequence generation circuit 400 to generate the random sequence data RSD using the page address or the page address and the block address included in the inputted row address as a seed value. The generated random sequence data RSD is loaded into the page buffer circuit 310 through the multiplexer 360 and the column selector 320 under the control of the control logic 350. See, 512 in FIG. 12. That is, the program data DI and the random sequence data RSD are loaded into page buffers of the page buffer circuit 310, each of which includes latches to store the program data DI and the random sequence data RSD.

Figure 13:
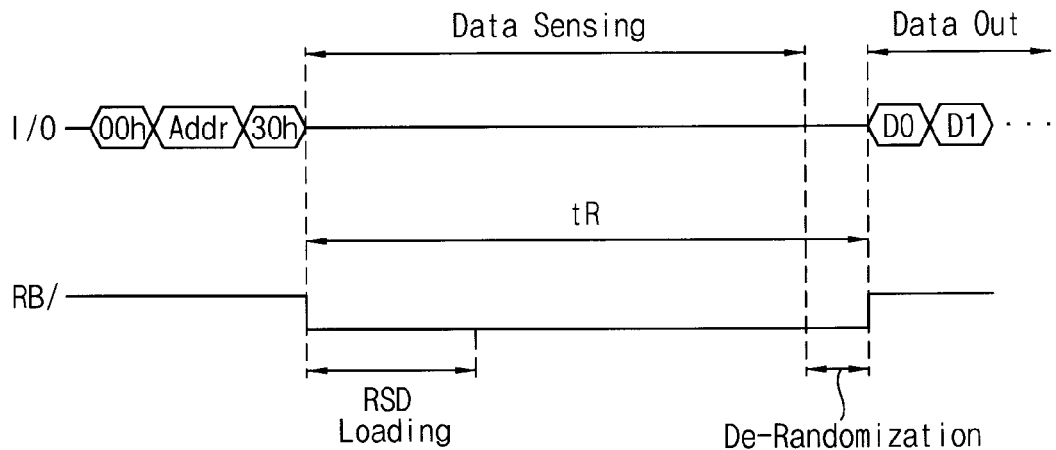
FIG. 13 is a timing diagram illustrating a read operation for a nonvolatile memory device according to certain embodiments of the inventive concept.
Figure 14:
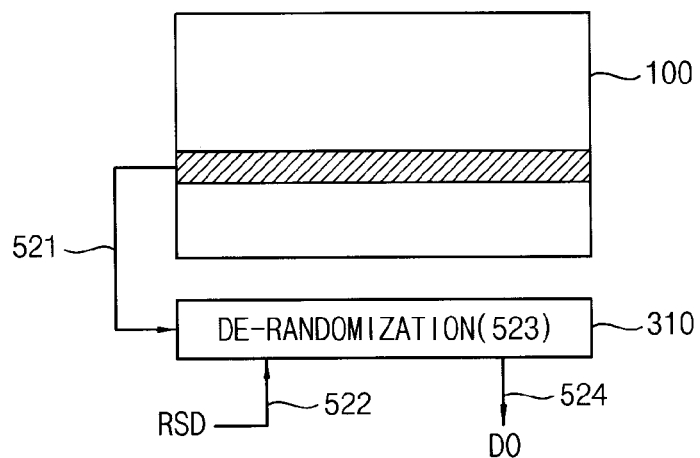
FIG. 14 is a conceptual diagram illustrating data flow in the nonvolatile memory device during read operation according to certain embodiments of the inventive concept.

Once the program data DI and the random sequence data RSD are loaded into page buffers, the control logic 350 controls the page buffer circuit 310 to randomize the program data DI based on the random sequence data RSD. See, 513 in FIG. 12. In this example, a bit-wise XOR operation is performed in the page buffer circuit 310 so that the program data D1 is randomized. Then, the randomized data are programmed to the memory cells associated with the page address. See, 514 in FIG. 12. In FIG. 11, tPROG denotes the total programming time including the random sequence loading, randomization, and cell programming FIG. 13 is a timing diagram illustrating a read operation of the nonvolatile memory device according to certain embodiments of the inventive concept. FIG. 14 illustrates data flow in the nonvolatile memory device during read operation of FIG. 13

First, a read operation, a '00h' command, an address (Addr) and a '30h' command are received by the nonvolatile memory device in a certain timing sequence. After the '30h' command is inputted, the Ready/Busy signal (RB/) changes to low indicating that the nonvolatile memory device is in a busy state. The page buffer block 310 begins to sense read data from the memory cells of the memory cell array 100 that are associated with the address, and the page buffer block 310 latches the read data, under the control of the control logic 350. See, 521 in FIG. 14. As illustrated in FIG. 13, a data sensing time includes a time required for random sequence data RSD loading. During the time the read data is sensed and latched, the control logic 350 controls the random sequence generation circuit 400 to generate a random sequence data RSD using a page address or the page address and a block address included in the inputted address as a seed value. The generated random sequence data RSD is loaded into the page buffer circuit 310 through the multiplexer 360 and the column selector 320, under the control of the control logic 350. See, 522 in FIG. 14.

Once data sensing and latching is completed, the control logic 350 controls the page buffer circuit 310 to execute a bit-wise XOR operation on the read data based on the random sequence data RSD that are latched in each page buffer. As a result, the read data is de-randomized as original data, i.e., the data is restored to its state before randomization during the program operation. See, 523 in FIG. 14. Thereafter, the de-randomized read data DO is outputted to the memory controller through the column selector 320 and the I/O interface 330. See, 524 in FIG. 14. In FIG. 13, tR denotes a read time including data sensing and de-randomization.

Figure 15:
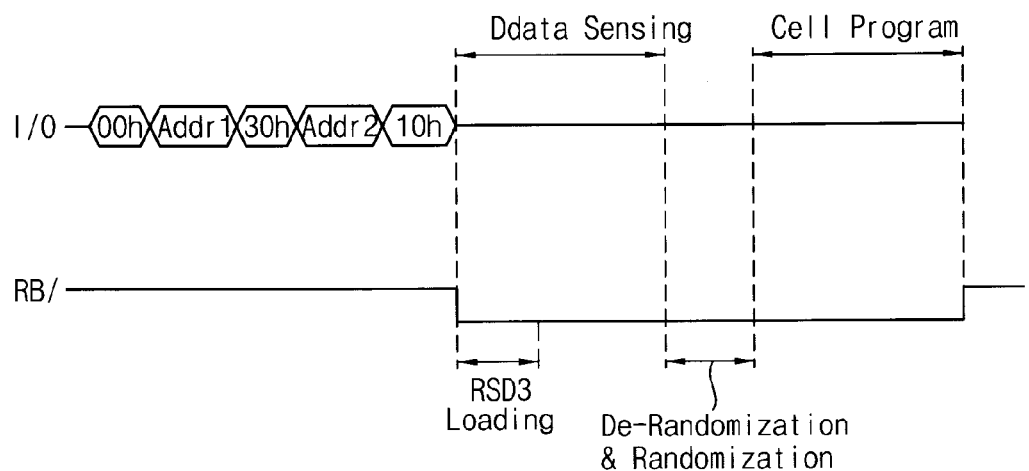
FIG. 15 is a timing diagram illustrating a copy back program operation for a nonvolatile memory device according to certain embodiments of the inventive concept.
Figure 16:
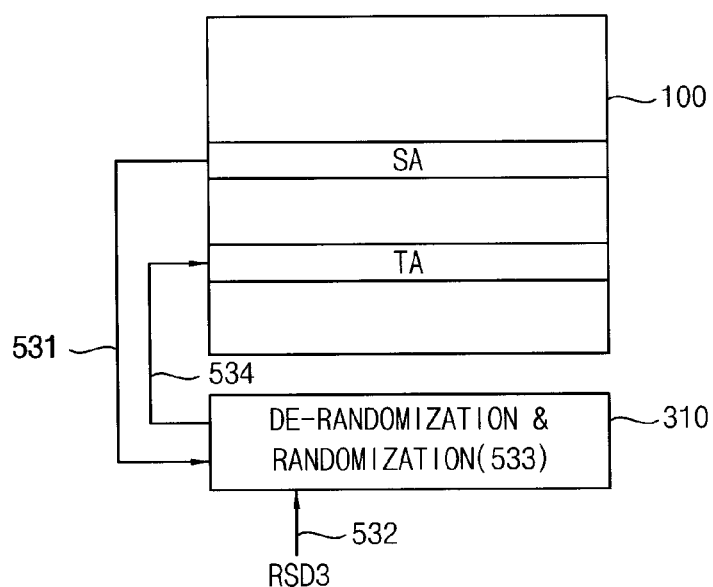
FIG. 16 is a conceptual diagram illustrating data flow in the nonvolatile memory device during the copy back program according to certain embodiments of the inventive concept.

FIG. 15 is a timing diagram illustrating a copy back program operation of the nonvolatile memory device according to certain embodiments of the inventive concept. FIG. 16 illustrates data flow in the nonvolatile memory device during the copy back program of FIG. 15.

During the copy back program operation, a '00h' command, an address (Addr), and a '30h' command are successively received by the nonvolatile memory device 10 from the memory controller in a certain timing sequence. After the '10h' command is received, the Ready/Busy signal (RB/) changes to low level indicate that the nonvolatile memory device 10 is in a busy state. Then the page buffer circuit 310 begins to sense a first random data from a source area SA designated by the source address Addr1 of the memory cell array 100 and latches the sensed first random data, under the control of the control logic 350. See, 531 in FIG. 16. During the sensing and latching time, the control logic 310 controls the random sequence generation circuit 400 to generate a third random sequence data RSD3 which is generated based on the first random sequence data RSD1 generated based on the page address or the page address and the block address included in source address Addr1 and the second random sequence data RSD2 generated based on the page address or the page address and the block address included in target address Addr2. The generated third random sequence data RSD3 is loaded into the page buffer circuit 310. See. 532 in FIG. 16. The third random sequence data RSD3 may be generated by performing bit-wise XOR operation on the first random sequence data RSD1 and the second random sequence data RSD2 in the random sequence generation circuit 400.

After data sensing and latching is completed, the control logic 310 controls the page buffer circuit 310 to execute a bit-wise XOR operation on the sensed first random data and the third random sequence data RSD3 that are stored in each page buffer. See, 533 in FIG. 16. When the bit-wise XOR operation is performed on the sensed first random data and the third random sequence data RSD3, the sensed first random data is derandomized and randomized to be generated as a second random data. The control logic 310 controls the page buffer circuit 310 to program the second random data to the target area TA of the memory cell array 100.

During the copy back program operation of the nonvolatile memory device 10 according to certain embodiments of the inventive concept, the third random sequence data RSD3 is generated by performing bit-wise exclusive OR operation on the first random sequence data RSD1 generated based on the address of the source area and the second random sequence data RSD2 generated based on the addresses of the target area, the second random data is generated by performing bit-wise exclusive OR operation on the sensed first random data and the third random sequence data RSD3 and the second random data is programmed in the target area of the memory cell array 100. Therefore, randomization and de-randomization are simultaneously performed on the first random data stored in the memory cell array 100, and thus, overhead for the copy back programming is markedly reduced.

Figure 17A:
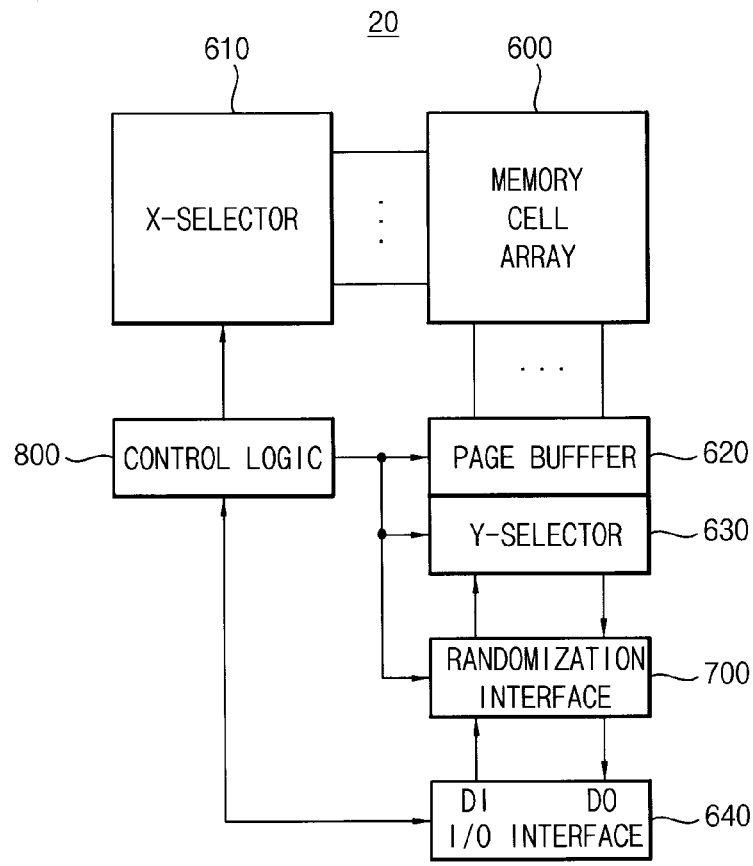
FIG. 17A is a block diagram illustrating a nonvolatile memory device according to certain embodiments of the inventive concept.

FIG. 17A is a block diagram illustrating a nonvolatile memory device according to certain embodiments of the inventive concept.

Referring to FIG. 17A, a nonvolatile memory device 20, which is assumed to be a flash memory device, comprises a memory cell array 600, a row selector 610 (x-selector), a page buffer circuit 620, a column selector (y-selector) 630, a randomization interface 700, an input/output (I/O) interface 640, and a control logic 800.

The memory cell array 600 includes a plurality of memory cells each of which is connected to a respective one of wordlines WL and a respective one of bitlines BL. As described above with reference to FIGS. 3 through 8, the plurality of memory cells may include NAND flash memory cells or NOR flash memory cells, and may be arranged in a two-dimensional (2-D) array structure or a three-dimensional (3-D) vertical array structure (e.g., a vertical memory device having a stacked structure).

The plurality of memory cells may include single-level memory cells (SLC) in which only one bit is stored in each of memory cells and/or multi-level memory cells (MLC) in which more than two bits are stored in each of memory cells. In the MLC, the memory cells may be programmed using various program methods, such as a shadow programming scheme, a reprogramming scheme or an on-chip buffered programming scheme.

The row selector 610 is controlled by the control logic 800 and performs selecting and driving operations for rows of the memory cell array 600. The control logic 800 is configured to control an overall operation of the flash memory device. The page buffer circuit 620 is controlled by the control logic 800 and functions as a sense amplifier or a write driver according to an operation mode. For example, during a read operation, a page buffer circuit 620 functions as a sense amplifier sensing data from memory cells of a selected row. During a program operation, the page buffer circuit 620 functions as a write driver driving memory cells of a selected row according to program data. The page buffer circuit 620 includes page buffers corresponding to each of bit lines or bit line pairs. When respective memory cells store multi-bit data, respective page buffers of the page buffer circuit 620 may be configured to have two or more latches.

The column selector 630 is controlled by the control logic 800 and selects columns (or page buffers) in a predetermined sequence during read/program operation. The I/O interface 640 provides output data from the randomization interface 700 to an external circuit such as a memory controller.

The randomization interface 700 may randomize data transferred through the I/O interface 640 (i.e., data to be programmed) under the control of the control logic 800 in a program operation. The randomization interface 700 may derandomize data of the page buffer circuit 620 transferred through the column selector 630 under the control of the control logic 800 in a read operation. The randomization interface 700 may receive a first random data read from a source area of the memory cell array 600 through the page buffer circuit 620, may simultaneously derandomize and randomize the first random data to a second random data, and mat provide the second random data to the page buffer circuit 620 and the page buffer circuit 620 program the second random data to a target area of the memory cell array 600 under the control of the control logic 800 in a copyback program of the nonvolatile memory device 20.

Figure 17B:
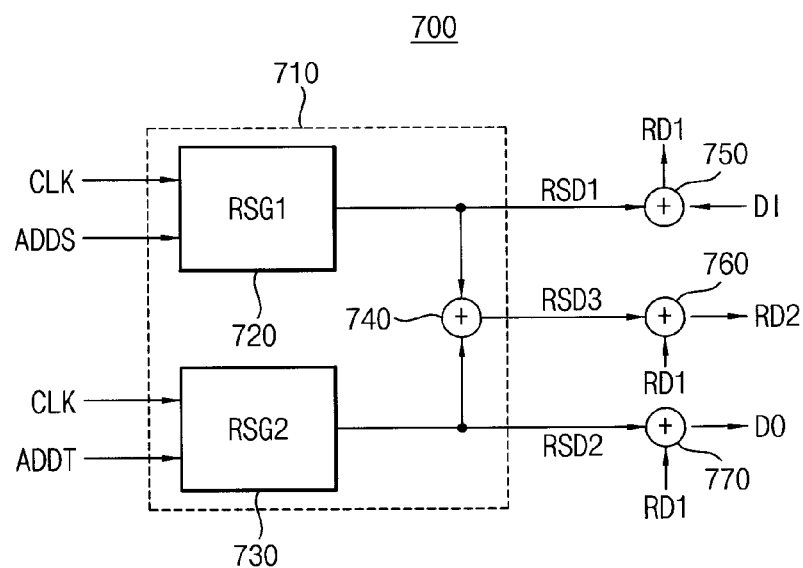
FIG. 17B is a block diagram further illustrating the randomization interface of FIG. 17A according to certain embodiments of the inventive concept.

FIG. 17B is a block diagram further illustrating the randomization interface of FIG. 17A according to certain embodiments of the inventive concept.

Referring to FIG. 17A, a randomization interface 700 may include a random sequence generation unit 710 and XOR gates 750, 760 and 770. The random sequence generation unit 710 may include may include a first random sequence generator 720, a second random sequence generator 730 and a XOR gate 740. The randomization interface 700 may further include an address buffer such as the address buffer 410 in FIG. 9 although not illustrated.

The first random sequence generator (RSG1) 720 may generate a first random sequence data RSD1 according to a clock signal CLK by using a source addresses ADDS as seed values. The second random sequence generator (RSG2) 730 may generate a second random sequence data RSD2 according to the clock signal CLK by using a target addresses ADDT as seed values. The XOR gate 740 may perform bit-wise XOR operation on the first random sequence data RSD1 and the second random sequence data RSD2 to generate a third random sequence data RSD3.

The XOR gate 750 may perform bit-wise XOR operation on the first random sequence data RSD1 and a program (input) data DI from the I/O interface 640 to generate a first random data RD1 that the program data D1 is randomized in a program operation of the nonvolatile memory device 20. The first random data RD1 is provided to the page buffer circuit 620 through the column selector 630 under the control of the control logic 800 and is programmed to corresponding area of the memory cell array 600.

The XOR gate 770 may perform bit-wise XOR operation (that is, derandomize the first random data RD1) on the second random sequence data RSD2 and the first random data RD1 transferred through the page buffer circuit 620 and the column selector 630 from the memory cell array 600 to provide an output data DO to the I/O interface 700 in a read operation of the nonvolatile memory device 20.

The XOR gate 740 may perform bit-wise XOR operation on the first random sequence data RSD1 generated based on a source address ADDS of the source area of the memory cell array 600 and the second random sequence data RSD2 generated based on a target address ADDT of the target area of the memory cell array 600 to generate the third random sequence data RSD3 in a copyback program operation of the nonvolatile memory device 20. The XOR gate 760 performs bit-wise XOR operation on the first random data RD1 programmed in the source area of the memory cell array 600 and the third random sequence data RSD3. The first random data RD1 is simultaneously derandomozed and randomized by the performed bit-wise XOR operation, and a second random data RD2 is generated. The second random data RD2 is transferred to the page buffer circuit 620 through the column selector 630 and the second random data RD2 is programmed in the target area of the memory cell array 600 under the control of control logic 800.

Figure 17C:
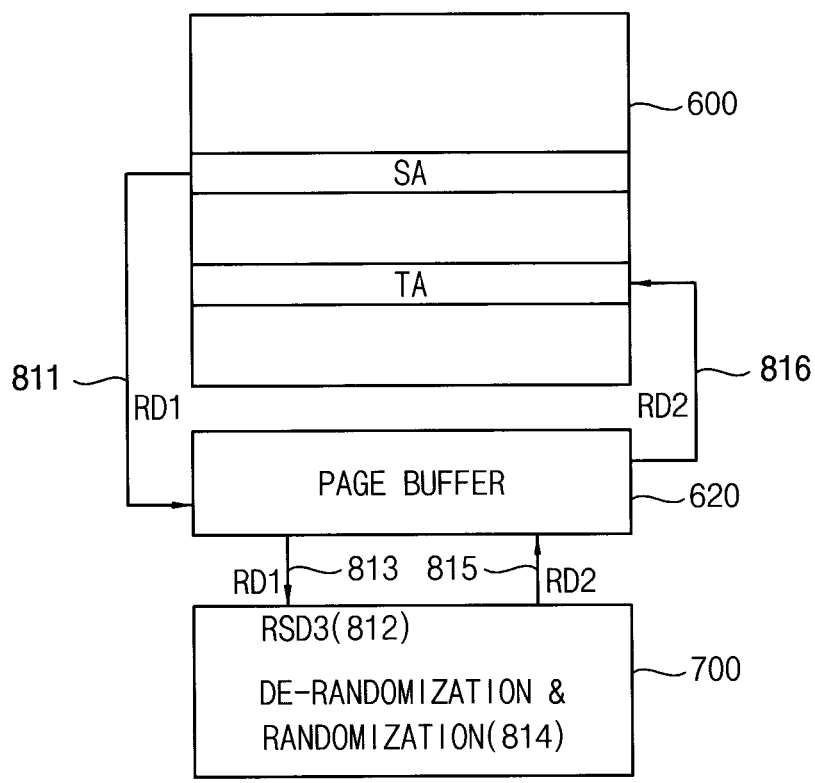
FIG. 17C illustrates data flow in the nonvolatile memory device during the copy back program according to certain embodiments of the inventive concept.

FIG. 17C illustrates data flow in the nonvolatile memory device during the copy back program according to certain embodiments of the inventive concept. One example of the copy back program operation for the nonvolatile memory device 20 will be described in some additional detail with reference to FIGS. 17A, 17B and 17C.

When the copyback program is initiated, the page buffer circuit 620 begins to sense a first random data RD1 from source area SA designated by the source address ADDS of the memory cell array 100 and latches the sensed first random data RD1, under the control of the control logic 800. See, 811 in FIG. 17C. The first random data RD1 is a data that the input data DI is randomized based on the source address ADDS and is programmed in the source area. During the sensing and latching time, the control logic 800 controls the randomization interface 700 to generate the third random sequence data RSD3 which is generated based on the first random sequence data RSD1 generated based on the page address or the page address and the block address included in source address ADDS and the second random sequence data RSD2 generated based on the page address or the page address and the block address included in the target address ADDT. The generated third random sequence data RSD3 is loaded into the page buffer circuit 310 See, 812 in FIG. 17C.

The control logic 800 controls the page buffer circuit 620 such that the first random data RD1 is loaded to the randomization interface 700 from the page buffer circuit 620. See, 813 in FIG. 17C. The randomization interface 700 performs bit-wise XOR operation on the first random data RD1 and the third random sequence data RSD3 under the control of the control logic 620. See, 814 in FIG. 17C. The first random data RD1 may be simultaneously derandomized and randomized by the performed bit-wise XOR operation, and the second random data RD2 is generated. The second random data RD2 is transferred to the page buffer circuit 620 through the column selector 630 under the control of the control logic 800. See, 815 in FIG. 17C. The second random data RD2 is programmed to the target area TA of the memory cell array 600. See, 816 in FIG. 17C.

In the copyback program operation of the nonvolatile memory device 20, the third random sequence data RSD3 is generated by performing bit-wise exclusive OR operation on the first random sequence data RSD1 generated based on the address of the source area and the second random sequence data RSD2 generated based on the addresses of the target area, the second random data is generated by performing bit-wise exclusive OR operation on the sensed first random data and the third random sequence data RSD3 and the second random data is programmed in the target area of the memory cell array 100. Therefore, randomization and de-randomization are simultaneously performed on the first random data stored in the memory cell array 100 in the randomization interface 700, and thus, data transfer and data computation overhead for the copy back programming is markedly reduced.

Figure 18:
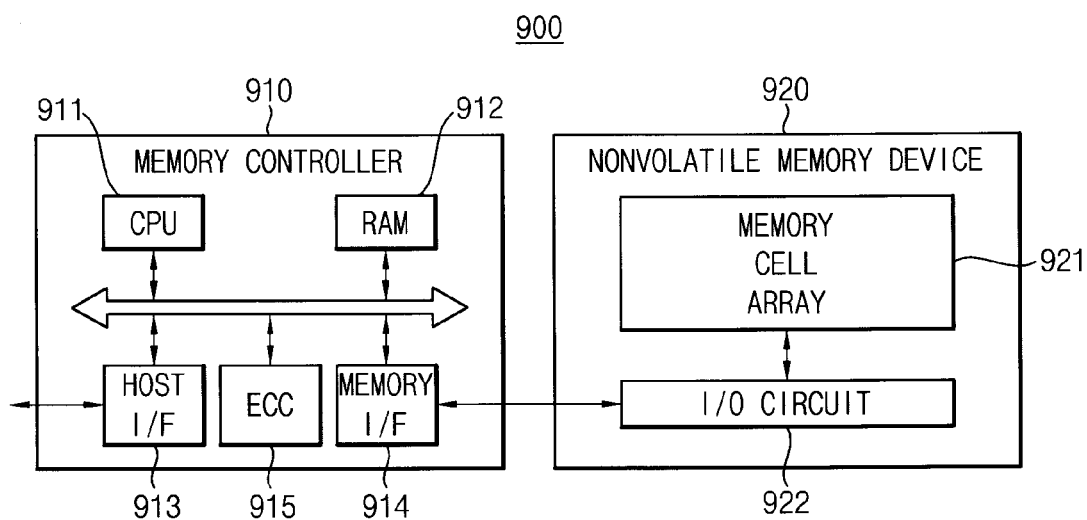
FIG. 18 is a block diagram illustrating a memory system incorporating an embodiment of the inventive concept.

FIG. 18 is a block diagram illustrating a memory system that may incorporate as a memory system or a memory system operating method an embodiment of the inventive concept.

Referring to FIG. 18, a memory system 900 includes a memory controller 910 and a nonvolatile memory device 920.

The nonvolatile memory device 920 includes a memory cell array 921 and an I/O circuit 922. The I/O circuit 922 may include page buffers that are coupled to bitlines, and may store data to be written in the memory cell array 921 or data read out from the memory cell array 921. The memory cell array 921 may include memory cells coupled to wordlines and the bitlines. The nonvolatile memory device 920 may perform a copyback program by simultaneously derandomizing and randomizing a first random data from a source area of the memory cell array to generate a second random data and programming the second random data to a target area of the memory cell array. Therefore, the nonvolatile memory device 920 may reduce a time required for the copyback program and may reduce an overhead that may occur during the copyback program.

The memory controller 910 may control the nonvolatile memory device 920. The memory controller 910 may control data transfer between an external host (not illustrated) and the nonvolatile memory device 920. The memory controller 910 may include a central processing unit 911, a buffer memory 912, a host interface 913 and a memory interface 914. The central processing unit 911 may perform operations for the data transfer. The buffer memory 912 may be implemented by a dynamic random access memory (DRAM), a static random access memory (SRAM), a PRAM, a FRAM, a RRAM, a MRAM, etc. According to embodiments, the buffer memory 912 may be located internal or external to the memory controller 910.

The host interface 913 may be coupled to the host, and the memory interface 914 may be coupled to the nonvolatile memory device 920. The central processing unit 911 may communicate with the host via the host interface 913. For example, the host interface 913 may be configured to communicate with the host using at least one of various interface protocols, such as a universal serial bus (USB), a multimedia card (MMC), a peripheral component interconnect-express (PCI-E), a small computer system interface (SCSI), a serial-attached SCSI (SAS), a serial advanced technology attachment (SATA), a parallel advanced technology attachment (PATA), an enhanced small disk interface (ESDI), integrated drive electronics (IDE), etc. Further, the central processing unit 911 may communicate with the nonvolatile memory device 920 via the memory interface 914. The memory controller 910 may further include an error correction block 915 for error correction. The memory controller 910 may be implemented in the nonvolatile memory device 920, or the memory controller 910 and the nonvolatile memory device 920 may be implemented as separate chips.

The memory system 900 may be implemented as a memory card, a solid state drive, etc. The nonvolatile memory device 920, the memory controller 910 and/or the memory system 900 may be packaged in various forms, such as package on package (PoP), ball grid arrays (BGAs), chip scale packages (CSPs), plastic leaded chip carrier (PLCC), plastic dual in-line package (PDIP), die in waffle pack, die in wafer form, chip on board (COB), ceramic dual in-line package (CERDIP), plastic metric quad flat pack (MQFP), thin quad flat pack (TQFP), small outline IC (SOIC), shrink small outline package (SSOP), thin small outline package (TSOP), system in package (SIP), multi chip package (MCP), wafer-level fabricated package (WFP), or wafer-level processed stack package (WSP).

Figure 19:
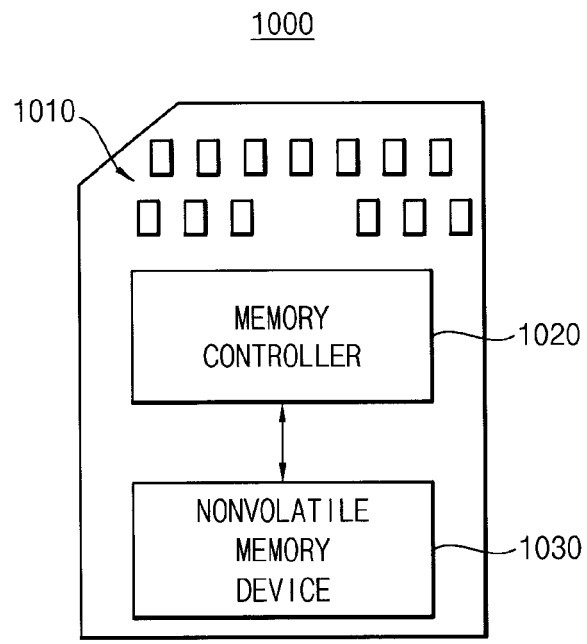
FIG. 19 is a diagram illustrating a memory card incorporating an embodiment of the inventive concept.

FIG. 19 is a diagram illustrating a memory card that may incorporate as a memory system or memory system operating method an embodiment of the inventive concept.

Referring to FIG. 19, a memory card 1000 may include a plurality of connecting pins 1010, a memory controller 1020 and a nonvolatile memory device 1030.

The connecting pins 1010 may be coupled to a host (not illustrated) to transfer signals between the host and the memory card 1000. The connecting pins 1010 may include a clock pin, a command pin, a data pin and/or a reset pin.

The memory controller 1020 may receive data from the host, and may store the received data in the nonvolatile memory device 1030.

The nonvolatile memory device 1030 may include memory cells, and may perform a copyback program by simultaneously derandomizing and randomizing a first random data from a source area of the memory cell array to generate a second random data and programming the second random data to a target area of the memory cell array. Therefore, the nonvolatile memory device 1030 may reduce a time required for the copyback program and may reduce an overhead that may occur during the copyback program.

For example, the memory card 1000 may include a MMC, an embedded MMC (eMMC), a hybrid embedded MMC (hybrid eMMC), a secure digital (SD) card, a micro-SD card, a memory stick, an ID card, a personal computer memory card international association (PCMCIA) card, a chip card, a USB card, a smart card, a compact flash (CF) card, etc.

The memory card 1000 may be coupled to the host, such as a desktop computer, a laptop computer, a tablet computer, a mobile phone, a smart phone, a music player, a personal digital assistants (PDA), a portable multimedia player (PMP), a digital television, a digital camera, a portable game console, etc.

Figure 20:
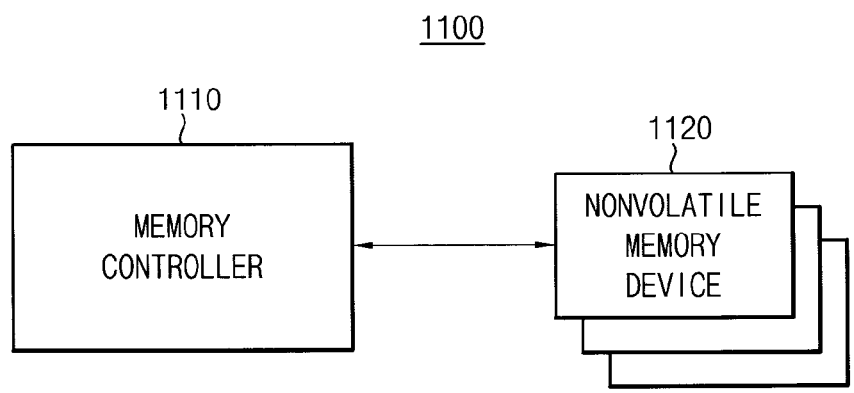
FIG. 20 is a diagram illustrating a solid state drive incorporating an embodiment of the inventive concept.

FIG. 20 is a diagram illustrating a solid state drive that may incorporate as a memory system or memory system operating method an embodiment of the inventive concept.

Referring to FIG. 20, a solid state drive (SSD) 1100 includes a memory controller 1110 and a plurality of nonvolatile memory devices 1120.

The memory controller 1110 may receive data from a host (not illustrated). The memory controller 1110 may store the received data in the plurality of nonvolatile memory devices 1120.

The nonvolatile memory device 1120 may include memory cells, and may perform a copyback program by simultaneously derandomizing and randomizing a first random data from a source area of the memory cell array to generate a second random data and programming the second random data to a target area of the memory cell array. Therefore, the nonvolatile memory device 1120 may reduce a time required for the copyback program and may reduce an overhead that may occur during the copyback program.

In some embodiments, the solid state drive 1100 may be coupled to the host, such as a mobile device, a mobile phone, a smart phone, a PDA, a PMP, a digital camera, a portable game console, a music player, a desktop computer, a notebook computer, a tablet computer, a speaker, a video, a digital television, etc.

Figure 21:
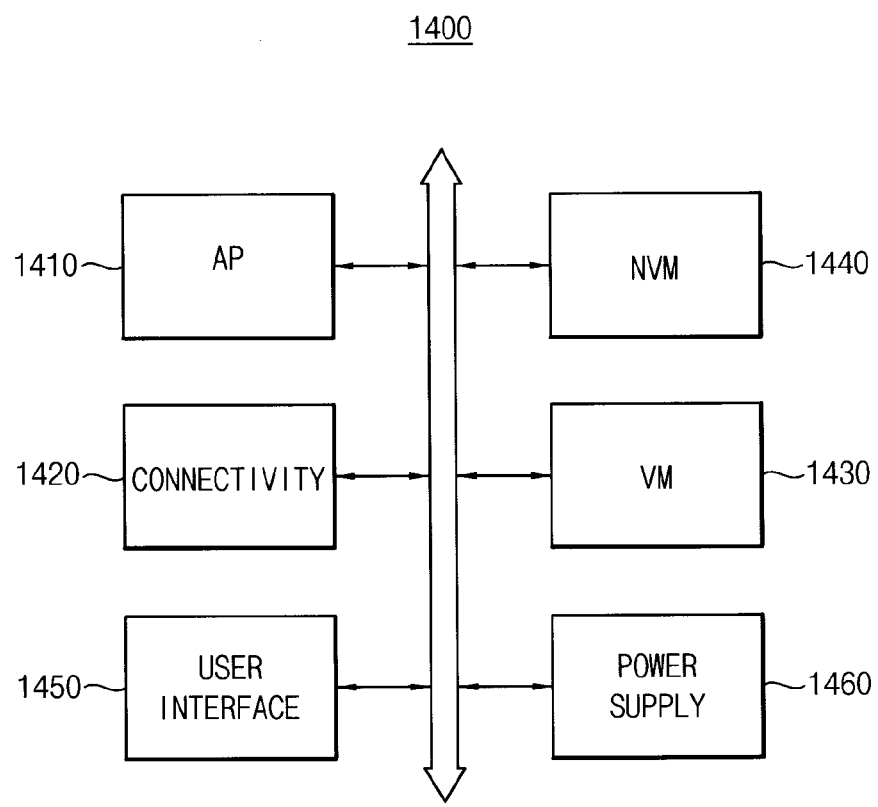
FIG. 21 is a diagram illustrating a mobile system incorporating an embodiment of the inventive concept.

FIG. 21 is a diagram illustrating a mobile system that may incorporate as a memory system or memory system operating method an embodiment of the inventive concept.

Referring to FIG. 21, a mobile system 1400 includes an application processor 1410, a connectivity unit 1420, a volatile memory device 1430, a nonvolatile memory device 1440, a user interface 1450 and a power supply 1460. The mobile system 1400 may be any mobile system, such as a mobile phone, a smart phone, a tablet computer, a laptop computer, a PDA, a PMP, a digital camera, a portable game console, a music player, a camcorder, a video player, a navigation system, etc.

The application processor 1410 may execute applications, such as an internet browser, a game application, a video player application, etc. The application processor 1410 may include a single processor core or a plurality of processor cores. For example, the application processor 1410 may be a multi-core processor, such as a dual-core processor, a quad-core processor, a hexa-core processor, etc. The application processor 1410 may further include a cache memory located inside or outside the application processor 1410.

The connectivity unit 1420 may perform wired or wireless communication with an external device. For example, the connectivity unit 1420 may perform a USB communication, an Ethernet communication, a near field communication (NFC), a radio frequency identification (RFID) communication, a mobile telecommunication, a memory card communication, wireless internet, wireless fidelity (Wi-Fi), global positioning system (GPS), Bluetooth (BT), global system for mobile communication (GSM), general packet radio system (GPRS), wideband code division multiple access (WCDMA), high speed uplink/downlink packet access (HSxPA), etc. The connectivity unit 1420 may include a baseband chipset.

The volatile memory device 1430 may store an instruction/data processed by the application processor 1410, or may serve as a working memory. For example, the volatile memory device 1430 may be implemented by a DRAM, a SRAM, a mobile DRAM, or the like.

The nonvolatile memory device 1440 may store a boot image for booting the mobile system 1400. For example, the nonvolatile memory device 1440 may be implemented by an electrically erasable programmable read-only memory (EEPROM), a flash memory, a PRAM, a RRAM, a MRAM, a FRAM, a nano floating gate memory (NFGM), a polymer random access memory (PoRAM), or the like. The nonvolatile memory device 1440 may include memory cells, and may perform a copyback program by simultaneously derandomizing and randomizing a first random data from a source area of the memory cell array to generate a second random data and programming the second random data to a target area of the memory cell array. Therefore, the nonvolatile memory device 1440 may reduce a time required for the copyback program and may reduce overhead for execution of the copy back program.

The user interface 1450 may include at least one input device, such as a keypad, a touch screen, etc., and at least one output device, such as a display device, a speaker, etc. The power supply 1460 may supply the mobile system 1400 with power. The mobile system 1400 may further include a camera image processor (CIS), storage device, such as a memory card, a SDD, a CD-ROM, etc.

The mobile system 1400 and/or components of the mobile system 1400 may be packaged in various forms, such as package on package (PoP), ball grid arrays (BGAs), chip scale packages (CSPs), plastic leaded chip carrier (PLCC), plastic dual in-line package (PDIP), die in waffle pack, die in wafer form, chip on board (COB), ceramic dual in-line package (CERDIP), plastic metric quad flat pack (MQFP), thin quad flat pack (TQFP), small outline IC (SOIC), shrink small outline package (SSOP), thin small outline package (TSOP), system in package (SIP), multi chip package (MCP), wafer-level fabricated package (WFP), or wafer-level processed stack package (WSP).

Figure 22:
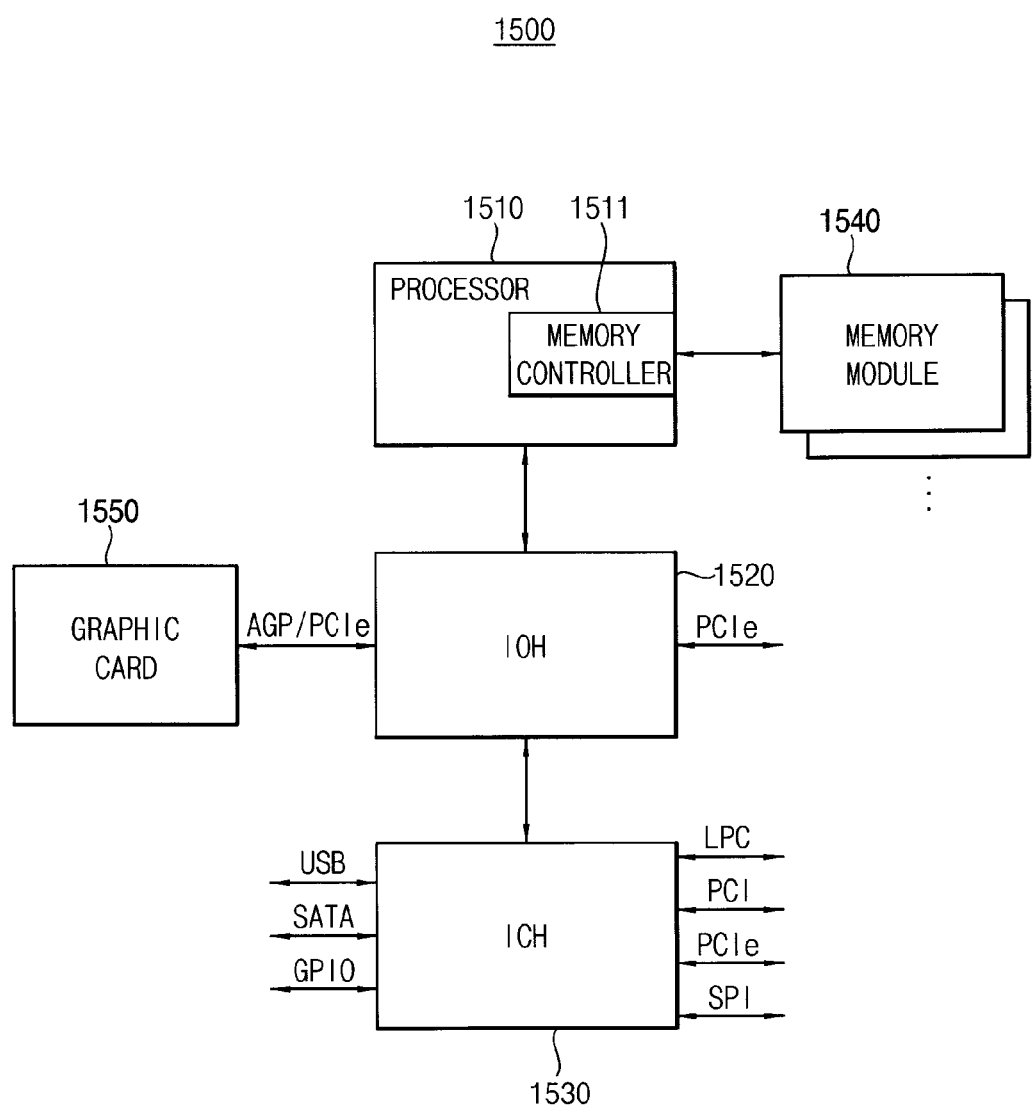
FIG. 22 is a diagram illustrating a computational system incorporating an embodiment of the inventive concept.

FIG. 22 is a diagram illustrating a computing system that may incorporate as a memory system or memory system operating method an embodiment of the inventive concept.

Referring to FIG. 22, a computing system 1500 includes a processor 1510, an I/O hub 1520, an I/O controller hub 1530, at least one memory module 1540 and a graphic card 1550. According to embodiments, the computing system 1500 may be any computing system, such as a personal computer (PC), a server computer, a workstation, a tablet computer, a laptop computer, a mobile phone, a smart phone, a PDA, a PMP, a digital camera, a digital television, a set-top box, a music player, a portable game console, a navigation device, etc.

The processor 1510 may perform specific calculations or tasks. For example, the processor 1510 may be a microprocessor, a central process unit (CPU), a digital signal processor, or the like. The processor 1510 may include a single processor core or a plurality of processor cores. The processor 1510 may be a multi-core processor, such as a dual-core processor, a quad-core processor, a hexa-core processor, etc. Although the example illustrated in FIG. 22 includes only one processor 1510, other embodiments may include a plurality of processors. In certain embodiments, the processor 1510 may further include a cache memory located inside or outside the processor 1510.

The processor 1510 may include a memory controller (not illustrated) that controls an operation of the memory module 1540. The memory controller included in the processor 1510 may be referred to as an integrated memory controller (IMC). A memory interface between the memory controller and the memory module 1540 may be implemented by one channel including a plurality of signal lines, or by a plurality of channels. Each channel may be coupled to at least one memory module 1540. The memory controller may be included in the I/O hub 1520. The I/O hub 1520 including the memory controller may be referred to as a memory controller hub (MCH).

The memory module 1540 may include a plurality of nonvolatile memory devices that store data provided from the memory controller 1511. The nonvolatile memory devices may include memory cells, and may perform a copyback program by simultaneously derandomizing and randomizing a first random data from a source area of the memory cell array to generate a second random data and programming the second random data to a target area of the memory cell array. Therefore, the nonvolatile memory devices may reduce the time required for execution of the copy back program and may also reduce execution overhead for the copy back program.

The I/O hub 1520 may manage data transfer between the processor 1510 and devices, such as the graphic card 1550. The I/O hub 1520 may be coupled to the processor 1510 via at least one of various interfaces, such as a front side bus (FSB), a system bus, a HyperTransport, a lightning data transport (LDT), a QuickPath interconnect (QPI), a common system interface (CSI), etc. Although FIG. 22 illustrates an example of the computing system 1500 including one I/O hub 1520, according to embodiments, the computing system 1500 may include a plurality of I/O hubs.

The I/O hub 1520 may provide various interfaces with the devices. For example, the I/O hub 1520 may provide an accelerated graphics port (AGP) interface, a peripheral component interface-express (PCIe), a communications streaming architecture (CSA) interface, etc.

The graphic card 1550 may be coupled to the I/O hub 1520 via the AGP or the PCIe. The graphic card 1550 may control a display device (not illustrated) for displaying an image. The graphic card 1550 may include an internal processor and an internal memory to process the image. In certain embodiments, the input/output hub 1520 may include an internal graphic device along with or instead of the graphic card 1550. The internal graphic device may be referred to as an integrated graphics, and an I/O hub including the memory controller and the internal graphic device may be referred to as a graphics and memory controller hub (GMCH).

The I/O controller hub 1530 may perform data buffering and interface arbitration to efficiently operate various system interfaces. The I/O controller hub 1530 may be coupled to the I/O hub 1520 via an internal bus. For example, the I/O controller hub 1530 may be coupled to the I/O hub 1520 via at least one of various interfaces, such as a direct media interface (DMI), a hub interface, an enterprise Southbridge interface (ESI), PCIe, etc.

The I/O controller hub 1530 may provide various interfaces with peripheral devices. For example, the I/O controller hub 1530 may provide a universal serial bus (USB) port, a serial advanced technology attachment (SATA) port, a general purpose input/output (GPIO), a low pin count (LPC) bus, a serial peripheral interface (SPI), a PCI, a PCIe, etc.

In certain embodiments, the processor 1510, the I/O hub 1520 and the I/O controller hub 1530 may be implemented as separate chipsets or separate integrated circuits. In other embodiments, at least two of the processor 1510, the I/O hub 1520 and the I/O controller hub 1530 may be implemented as one chipset.

The above described embodiments may be used in any device or system including a nonvolatile memory device, such as a mobile phone, a smart phone, a PDA, a PMP, a digital camera, a digital television, a set-top box, a music player, a portable game console, a navigation device, a PC, a server computer, a workstation, a tablet computer, a laptop computer, a smart card, a printer, etc.

The foregoing is illustrative of embodiments and is not to be construed as limiting thereof. Although a few embodiments have been described, those skilled in the art will readily appreciate that many modifications are possible in the embodiments without materially departing from the scope of the inventive concept as set forth in the accompanying claims. Therefore, it is to be understood that the foregoing is illustrative of various embodiments and is not to be construed as limited to the specific embodiments disclosed, and that modifications to the disclosed embodiments, as well as other embodiments, are intended to be included within the scope of the claims.

What is claimed is:

1. A method of operating a nonvolatile memory device including a memory cell array having respectively designated source and target areas, and a page buffer circuit, the method comprising:
    sensing first random data stored in the source area, the first random data having been generated using first random sequence data, and while sensing the first random data, loading third random sequence data to the page buffer circuit, the third random sequence data being generated from the first random sequence data and second random sequence data;
    performing a logical operation on the sensed first random data and the third random sequence data in the page buffer circuit; and
    programming second random data to the target area, the second random data being generated by the performing of the logical operation,
    wherein the sensed first random data is simultaneously de-randomized and randomized by the logical operation performed on the sensed first random data and the third random sequence data.

2. The method of claim 1, wherein the first random sequence data is generated using at least one source area address as a seed value.

3. The method of claim 2, wherein the source area includes a source area page having a corresponding source area page address, and the first random sequence data is generated using the source area page address as a seed value.

4. The method of claim 3, wherein the source area further includes a source area block having a corresponding source area block address, and the first random sequence data is generated using the source area page address and the source area block address as seed values.

5. The method of claim 1, wherein the second random sequence data is generated using at least one target area address as a seed value.

6. The method of claim 5, wherein the target area includes a target area page having a corresponding target area page address, and the second random sequence data is generated using the target area page address as a seed value.

7. The method of claim 6, wherein the target area further includes a target area block having a corresponding target area block address, and the second random sequence data is generated using the target area page address and the target area block address as seed values.

8. The method of claim 1, wherein the third random sequence data is generated by performing a bit-wise exclusive-OR (XOR) operation on the first random sequence data and the second random sequence data.

9. The method of claim 8, wherein the logical operation performed on the sensed first random data and the third random sequence data is also a bit-wise XOR operation.

10. A method of operating a nonvolatile memory device comprising a memory cell array, a page buffer circuit and a randomization interface, the method comprising:
sensing first random data stored in a source area of the memory cell array, the first random data having been randomized based on a first random sequence data;
generating a third random sequence data in the randomization interface while sensing the first random data, the third random sequence data being generated based on the first random sequence data and a second random sequence data;
performing a logical operation on the sensed first random data and the third random sequence data in the randomization interface to generate second random data; and then,
programming the second random data to a target area of the memory cell array different from the source area,
wherein the sensed first random data is simultaneously de-randomized and randomized by the logical operation performed on the sensed first random data and the third random sequence data.

11. The method of claim 10, wherein the first random data is sensed in the page buffer circuit.

12. The method of claim 11, wherein the sensed first random data is provided from the page buffer circuit to the randomization interface.

13. The method of claim 10, wherein the third random sequence data is generated by performing a bit-wise exclusive-OR (XOR) operation on the first random sequence data and the second random sequence data.

14. The method of claim 13, wherein the logical operation performed on the sensed first random data and the third random sequence data is also a bit-wise XOR operation.

15. The method of claim 10, wherein the source area includes a source page having a corresponding source area page address, and the first random sequence data is generated using the source area page address as a seed value, and
the target area includes a target page having a corresponding target area page address, and the second random sequence data is generated using the target page address as seed value.

16. A method of performing a copy back operation in a nonvolatile memory device including a memory cell array having respectively designated source and target areas, the method comprising:
sensing first random data stored in the source area, the first random data having been randomized from input data during a preceding program operation using first random sequence data;
while sensing the first random data, simultaneously loading third random sequence data to a page buffer circuit, the third random sequence data being generated by a bit-wise exclusive-OR (XOR) operation performed on the first random sequence data and second random sequence data;
performing a bit-wise XOR operation on the sensed first random data and the third random sequence data in the page buffer circuit to generate second random data; and then,
programming the second random data to the target area,
wherein the sensed first random data is simultaneously de-randomized and randomized by the bit-wise XOR operation performed on the sensed first random data and the third random sequence data.

17. The method of claim 16, wherein the source area includes a source area page having a corresponding source area page address, and the first random sequence data is generated using the source area page address as a seed value,
the target area includes a target area page having a corresponding target area page address, and the second random sequence data is generated using the target area page address as a seed value.

18. The method of claim 17, wherein the source area further includes a source area block having a corresponding source area block address, and the first random sequence data is generated using the source area page address and the source area block address as seed values, and
the target area further includes a target area block having a corresponding target area block address, and the second random sequence data is generated using the target area page address and the target area block address as seed values.

19. The method of claim 18, wherein the nonvolatile memory device is a flash memory device and the memory cell array is a three-dimensional memory cell array.

* * * * *